(12) United States Patent
Toyota et al.

(10) Patent No.: US 12,038,472 B2
(45) Date of Patent: Jul. 16, 2024

(54) TEST APPARATUS

(71) Applicant: ADVANTEST CORPORATION, Tokyo (JP)

(72) Inventors: Naoya Toyota, Tokyo (JP); Yasuki Akita, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 876 days.

(21) Appl. No.: 16/742,121

(22) Filed: Jan. 14, 2020

(65) Prior Publication Data

US 2020/0379030 A1 Dec. 3, 2020

(30) Foreign Application Priority Data

May 29, 2019 (JP) .................. 2019-100391

(51) Int. Cl.
*G01R 31/28* (2006.01)
*G01R 31/319* (2006.01)
*G01R 31/3193* (2006.01)

(52) U.S. Cl.
CPC ..... *G01R 31/287* (2013.01); *G01R 31/31907* (2013.01); *G01R 31/31935* (2013.01)

(58) Field of Classification Search
CPC ............ G01R 31/287; G01R 31/31907; G01R 31/31935; G01R 31/2882; G01R 31/31725; G01R 31/3016; G01R 1/0491; G01R 31/26–275; G01R 31/28–2898; G01R 31/303; H01L 21/67288
See application file for complete search history.

(56) References Cited

U.S. PATENT DOCUMENTS 6,154,715 A * 11/2000 Dinteman ........ G01R 31/31907
702/120
6,324,665 B1 11/2001 Fay
6,574,626 B1 * 6/2003 Regelman .............. G11C 29/56
711/2

(Continued)

FOREIGN PATENT DOCUMENTS

JP 2000266811 A 9/2000
JP 2002196051 A * 7/2002

(Continued)

OTHER PUBLICATIONS

USPTO Non-Final Office Action for U.S. Appl. No. 16/742,087. dated, Feb. 19, 2021.

(Continued)

*Primary Examiner* — Younes Boulghassoul
*Assistant Examiner* — Quinton A Brasfield
(74) *Attorney, Agent, or Firm* — CANTOR COLBURN LLP

(57) ABSTRACT

A test site includes: at least one test module that tests a device under test; and a waveform data acquisition module that converts an electrical signal relating to the DUT into a digital signal with a predetermined sampling rate so as to acquire waveform data in the form of a digital signal sequence. The higher-level controller controls the at least one test module and the waveform data acquisition module, and collects the waveform data acquired by the waveform data acquisition module in a form associated with the operation state of the at least one test module.

5 Claims, 17 Drawing Sheets

(56) References Cited

U.S. PATENT DOCUMENTS

| | | | |
|---|---|---|---|
| 11,009,544 B2* | 5/2021 | Uchida | G01R 31/31907 |
| 2012/0133380 A1* | 5/2012 | Ishikawa | G06F 11/2733 |
| | | | 324/750.01 |
| 2014/0237291 A1* | 8/2014 | Elston | G01R 31/31903 |
| | | | 714/25 |
| 2016/0216906 A1 | 7/2016 | Chen | |
| 2017/0337129 A1 | 11/2017 | Sang et al. | |
| 2020/0319248 A1* | 10/2020 | Li | G01R 31/31707 |
| 2020/0393509 A1 | 12/2020 | Kim et al. | |
| 2021/0011172 A1 | 1/2021 | Farley et al. | |

FOREIGN PATENT DOCUMENTS

| | | | |
|---|---|---|---|
| JP | 2002196051 A | | 7/2002 |
| JP | 2008164563 A | | 7/2008 |
| JP | 2008216030 A | | 9/2008 |
| JP | 2016223828 A | | 12/2016 |
| JP | 2017015477 A | * | 1/2017 |
| JP | 2017015477 A | | 1/2017 |
| JP | 2018117400 A | | 7/2018 |

OTHER PUBLICATIONS

USPTO Non-Final Office Action for corresponding U.S. Appl. No. 16/742,181, dated Jul. 23, 2021.
JP Notification of Reasons for Refusal corresponding to JP Application No. 2019-100390; dated Oct. 4, 2022.
JP Notification of Reasons for Refusal corresponding to JP Application No. 2019-100391; dated Oct. 4, 2022.

* cited by examiner

TEST APPARATUS

CROSS REFERENCE TO RELATED APPLICATIONS

The present application claims priority under 35 U.S.C. § 119 to Japanese Patent Application 2019-100391, filed on May 29, 2019, the entire contents of which being incorporated herein by reference.

BACKGROUND OF THE INVENTION

1. Field of the Invention

The present invention relates to a semiconductor test apparatus.

2. Description of the Related Art

In recent years, various kinds of semiconductor devices are known which are employed in various kinds of electronic devices. Examples of such semiconductor devices include: (i) memory devices such as DRAM (Dynamic Random Access Memory), flash memory, and the like; (ii) processors such as CPUs (Central Processing Units), MPUs (Micro-Processing Units), micro-controllers, and the like; and (iii) multifunctional devices such as digital/analog mixed devices, SoC (System On Chip), and the like. In order to test such semiconductor devices, a semiconductor test apparatus (which will also be referred to simply as a "test apparatus") is employed.

The test items for such semiconductor devices can be broadly classified into function tests, AC parametric tests, and DC (Direct Current) characteristic tests (DC tests). With a function test, judgment is made regarding whether or not a DUT (device under test) operates normally according to its design, and a defect portion is identified. With an AC parametric test, a timing parameter or a frequency is tested. With a DC test, leak current, operation current (power supply current), breakdown voltage, or the like of the DUT is measured.

The power supply current that flows through a semiconductor device is directly connected to the operation of the semiconductor device. Accordingly, the power supply current waveform includes a great amount of valuable information that can be used to analyze the state of the semiconductor device. The power supply voltage varies according to variation of the power supply current. Accordingly, the waveform of the power supply voltage also includes valuable information that can be used to analyze the device.

Typically, a semiconductor test apparatus employs a program which is a so-called test plan in order to indicate test items and the flow of the execution of the test items to the semiconductor test apparatus. In some cases, the test plan supports confirmation of whether or not an abnormal voltage or abnormal current having the potential to destroy the device under test is applied to a device under test before mass production. However, conventional semiconductor test apparatuses have no function of continuously acquiring an enormous amount of waveform data such as power supply voltage data or the like without involving time constraints in parallel with the execution of the test plan. Accordingly, such an arrangement requires the user to prepare an additional hardware component such as an oscilloscope or the like as necessary in addition to the semiconductor test apparatus. That is to say, there is a need to measure the power supply voltage waveform or the like in parallel while driving the semiconductor test apparatus.

Typically, a test plan includes several test items. In this case, it is anticipated that, by associating the acquired waveform with the test items of the test plan, such an arrangement provides a lot of information with respect to the device under test. However, in a case in which an external hardware component such as oscilloscope or the like is provided as an additional component, it is difficult to acquire the waveform in a form associated with the test items.

SUMMARY OF THE INVENTION

The present invention has been made in order to solve such a problem. Accordingly, it is an exemplary purpose of an embodiment of the present invention to provide a test apparatus that is capable of acquiring waveform data of an analog signal such as a power supply current, power supply voltage, or the like, in a form associated with the progress of the test in the test of a device.

An embodiment of the present invention relates to a test apparatus. The test apparatus comprises: at least one test module structured to test a device under test; a waveform data acquisition module structured to convert an electrical signal relating to the device under test into a digital signal with a predetermined sampling rate, and to acquire waveform data which is a sequence of the digital signal; and a higher-level controller structured to control said at least one test module and the waveform data acquisition module, and to collect the waveform data acquired by the waveform data acquisition module in a form associated with the operation state of said at least one test module.

Also, the higher-level controller may acquire the waveform data acquired by the waveform data acquisition module and a pass/fail data sequence acquired by the test module in a form associated with each other on the time axis.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
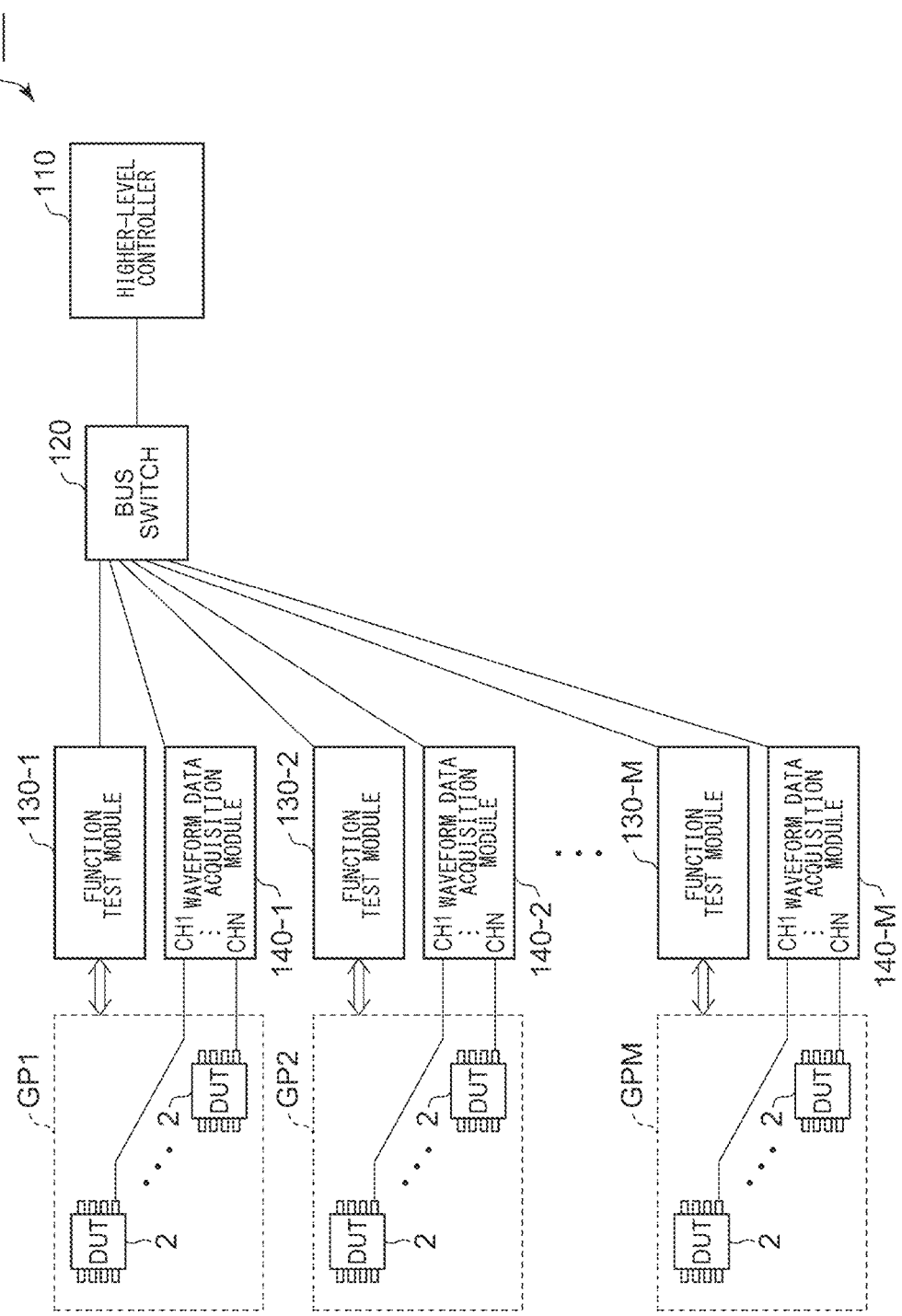
FIG. 1 is a block diagram showing a test apparatus according to an embodiment.

The invention will now be described based on preferred embodiments which do not intend to limit the scope of the present invention but exemplify the invention. All of the features and the combinations thereof described in the embodiment are not necessarily essential to the invention.

OVERVIEW OF THE EMBODIMENTS

An embodiment disclosed in the present specification relates to a test apparatus. The test apparatus comprises: at least one test module structured to test a device under test; a waveform data acquisition module structured to convert an electrical signal relating to the device under test into a digital signal with a predetermined sampling rate, and to acquire waveform data which is a sequence of the digital signal; and a higher-level controller structured to control said at least one test module and the waveform data acquisition module, and to collect the waveform data acquired by the waveform data acquisition module in a form associated with the operation state of the at least one test module.

In a case in which the test is executed while switching the test item between multiple test items, such an arrangement provides information with respect to which test item from among the multiple test items has provided each portion of the electrical signal waveform.

Also, the waveform data acquisition module may include a first bank and a second bank, and a memory controller structured to continuously write the digital data to either the first bank or the second bank, and, when a given bank has become full, to notify the higher-level controller that the bank is full, and to switch the writing target memory unit to the other bank. The higher-level controller may read data from the bank that has become full from among the first bank an second bank in response to a notification. With the waveform data acquisition module, by storing the waveform data in the two banks in an alternate manner, this arrangement is capable of continuously acquiring the waveform data without involving time constraints.

Also, the test apparatus may be structured to be capable of transmitting, to a data server, at least one from among collected data and data obtained based on the collected data. With this arrangement, the data server accumulates the waveform data or spectrum data with respect to a large number of devices under test tested and acquired in the mass-production stage, thereby generating big data. By utilizing the big data thus obtained, it is anticipated that this arrangement will provide novel defect analysis or screening. Also, such an arrangement is anticipated to provide knowledge for improving the design, manufacturing, and testing process.

Also, the higher-level controller may collect a data log including a pass/fail data sequence from the test module. Also, the pass/fail data sequence and the waveform data may be stored in a form associated with each other on the time axis. This arrangement allows the pass/fail data sequence and the electrical signal waveform to be associated with each other so as to make an analysis. This allows the test results to be checked in more detail.

With an embodiment, a test apparatus comprises: a waveform data acquisition module structured to convert an electrical signal relating to a device under test into a digital signal with a predetermined sampling rate, and to acquire waveform data which is a sequence of the digital signal; a test module structured to test the device under test; and a higher-level controller structured to control the waveform data acquisition module and the test module, and to collect data acquired by the waveform data acquisition module and the test module. The higher-level controller acquires the waveform data acquired by the waveform data acquisition module and a pass/fail data sequence acquired by the test module in a form associated with each other on the time axis.

Also, the electrical signal may be a power supply voltage or a power supply current of the device under test.

EMBODIMENTS

Description will be made below regarding the present invention based on preferred embodiments with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

Overall Configuration of Test Apparatus

FIG. 1 is a block diagram showing a test apparatus 100 according to an embodiment. The test apparatus 100 captures an electrical signal waveform that indicates an electrical state of each of multiple DUTs (devices under test) 2 in parallel while executing a function test. The kind of the electrical signal output from the DUT 2 to be captured by the test apparatus 100 is not restricted in particular. Examples of such electrical signals include a power supply voltage, a power supply current, etc.

Typically, a test for the DUTs 2 requires a very long period of time as compared with a sampling rate $F_S$. The test apparatus 100 has a function of continuously acquiring an electrical signal waveform over the whole of (or a part of) such a long period of time from the start up to the end of a test plan. The power supply voltage or power supply current to be captured by the test apparatus 100 will be collectively referred to as a "power supply signal" hereafter.

The test apparatus 100 includes a higher-level controller 110, a bus switch 120, multiple function test modules 130_1 through 130_N, and multiple waveform data acquisition modules 140_1 through 140_N.

The higher-level controller 110 is configured as a controller that integrally controls the overall operation of the test apparatus 100. As described later, the higher-level controller 110 is configured including a CPU (Central Processing Unit), a memory unit, a program to be executed by the CPU, and the like. The function test modules 130_1 through 130_M and the waveform data acquisition modules 140_1 through 140_N are coupled to the higher-level controller 110 via the bus switch 120. The higher-level controller 110 supplies an instruction to each function test module 130 and each waveform data acquisition module 140, or read data from such a module. The higher-level controller 110 collects an enormous amount of data (big data) for the multiple channels measured by the waveform data acquisition modules 140.

The multiple DUTs 2 are divided into multiple groups GP1 through GPM. Each function test module 130_i (i=1 to M) is associated with the corresponding waveform data acquisition module 140_i so as to form a pair, which is assigned to a common group GPi. Each function test module 130_i supplies data (test pattern) to each of multiple DUTs 2 within the assigned group GPi, reads data, and compares the data thus read with an expected value so as to judge whether or not the DUT 2 operates normally. The kind of the DUTs 2 are not restricted in particular. Examples of such DUTs 2 include microcontrollers, memory, CPUs (Central Processing Units), etc.

Each waveform data acquisition module 140_i captures the power supply signal waveform for each of the multiple DUTs 2 within the assigned group GP_i. Each waveform data acquisition module 140 is configured to have N channels (CH1 through CHN). Each channel is associated with a corresponding single pin. This arrangement allows a single electrical signal waveform to be captured for each channel.

In a case in which the power supply voltage and the power supply current are measured for each DUT 2, the number of DUTs 2 assigned to the N-channel waveform data acquisition module 140 is N/2. In a case in which N=96, the waveforms of the power supply voltage and the power supply current are acquired for 48 DUTs 2.

In a case in which the waveform data acquisition module 140 completely stores the power supply signal waveform over a period of time from the start up to the end of the test, the waveform data acquisition module 140 requires memory having a very large capacity, which is unrealistic from the cost viewpoint. Accordingly, description will be made below regarding an architecture configured to allow the capacity of memory mounted on each waveform data acquisition module 140 to be reduced.

Waveform Data Acquisition Module

Figure 2:
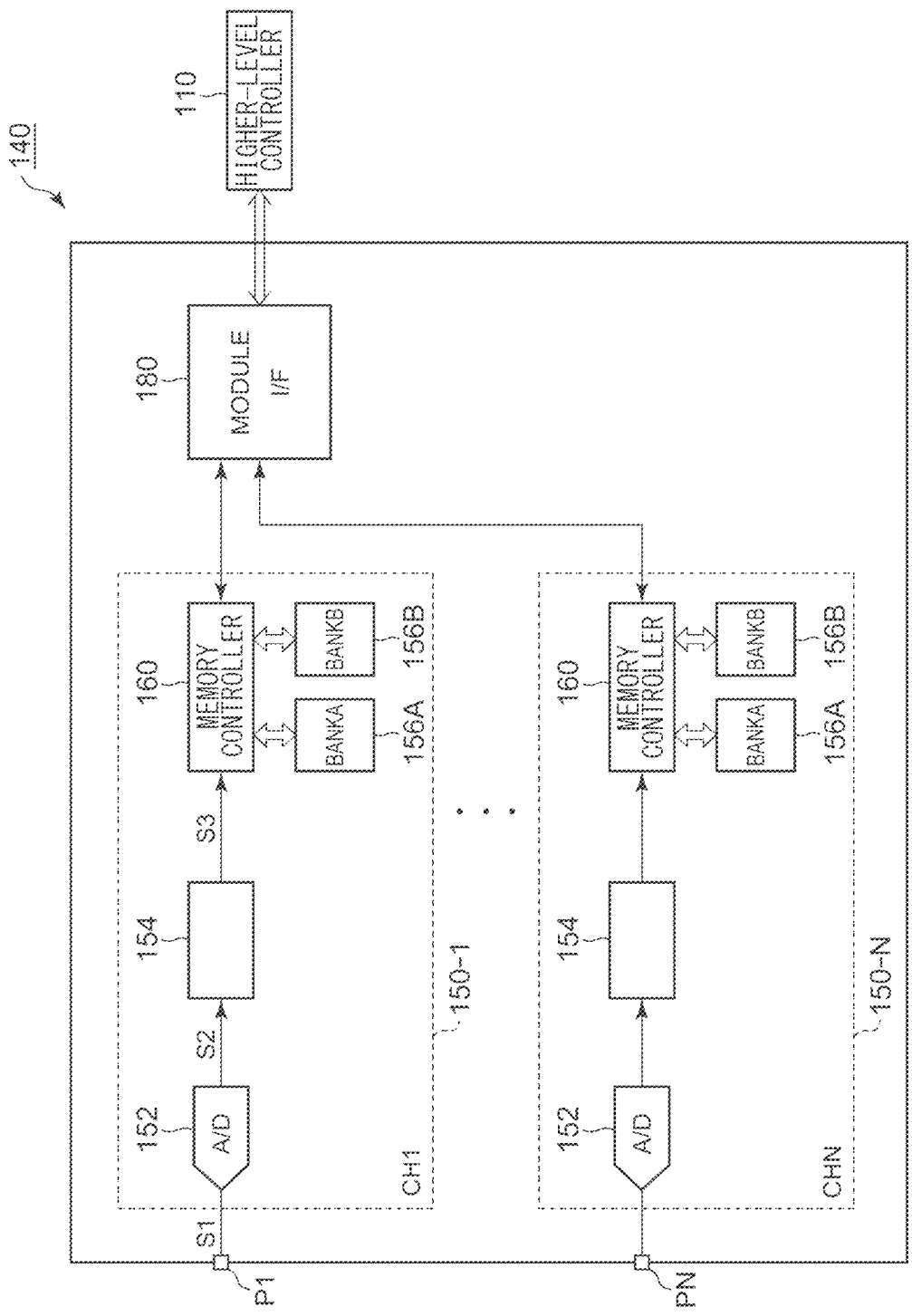
FIG. 2 is a block diagram showing a waveform data acquisition module.

FIG. 2 is a block diagram showing the waveform data acquisition module 140. As described above, the waveform data acquisition module 140 is configured to be capable of capturing the signal waveforms for the multiple channels CH1 through CHN.

The waveform data acquisition module 140 includes multiple capture units 150_1 through 150_N that correspond to the multiple channels CH1 through CHN, and a module interface 180.

The multiple capture units 150_1 through 150_N are each configured to have the same configuration. Each capture unit 150 includes an A/D converter 152, a signal processing unit 154, a first memory unit 156A, a second memory unit 156B, and a memory controller 160. The signal processing unit 154 and the memory controller 160 may be configured as an FPGA (Field Programmable Gate Array). In this case, the memory units 156A and 156B may be configured as SRAM built into the FPGA.

The A/D converter 152 converts a power supply signal (analog signal) S1 to be captured into a digital signal S2 at a predetermined sampling rate. The sampling rate can be individually set for each channel.

The signal processing unit 154 executes signal processing for the digital signal S2 as necessary. The content of the signal processing is not restricted in particular. Examples of the signal processing include calibration processing. Digital data S3 obtained after the signal processing by means of the signal processing unit 154 is input to the memory controller 160.

Two memory units 156A and 156B are coupled to the memory controller 160. The memory units 156A and 156B will be also referred to as "bank A (BANKA)" and "bank B (BANKB)". As each of the memory units 156A and 156B, low-cost memory having a capacity on the order of 8 k words may be employed.

The memory controller 160 alternately uses the two memory units 156A and 156B in a time-sharing manner. Specifically, the memory controller 160 writes the digital data to one memory unit 156# ("#" represents "A" or "B") from among the two memory units 156A and 156B. When the memory unit 156# becomes full, the memory controller 160 switches the writing target to which the digital data S3 is to be written to the other memory unit. Furthermore, the memory controller 160 asserts a flag MEMORY_FULL# ("#" represents "A" or "B") that indicates that the corresponding memory unit 156# has become full.

The module interface 180 is configured as an interface between the higher-level controller 110 and the multiple capture units 150_1 through 150_N.

The module interface 180 monitors the flag MEMORY_FULL_# ("#" represents "A" or "B") in each of the multiple channels CH1 to CHN and notifies the higher-level controller 110 of a channel for which the memory unit has become full.

Furthermore, the module interface 180 monitors errors that can occur in the capture units 150_1 through 150_N, and notifies the higher-level controller 110 of the error state. The module interface 180 notifies the higher-level controller 110 using a direct interrupt described later.

The higher-level controller 110 is capable of acquiring the information with respect to the channel ID number of the memory unit 156 that has become full. The higher-level controller 110 designates the channel that has become full, and issues a read command to the module interface 180.

With the present embodiment, this arrangement is configured to allow a desired number of multiple channels to be designated at the same according to a single memory command. Upon receiving the read command from the higher-level controller 110, the module interface 180 sequentially supplies a local read command LOCAL_READ to the designated channels. Upon receiving the local read command LOCAL_READ from the module interface 180, the memory controller 160 reads data from the bank that has become full, and outputs the data thus read. After the reading of the data from the bank that has become full has completed, the memory full flag MEMORY_FULL_# that corresponds to the bank is negated (deasserted).

The data acquired by the higher-level controller 110 in a single read operation is only a part of the waveform data. The higher-level controller 110 joins up the portions of the same channel waveform data so as to reconstruct the original continuous waveform data.

With the waveform data acquisition module 140, the two memory units 156A and 156B alternately store the waveform data. This allows an enormous amount of waveform data to be continuously acquired without involving time constraints. Furthermore, by transmitting a notification to the higher-level controller 110 every time the memory unit becomes full, such an arrangement is capable of prompting the higher-level controller 110 to read the data.

Memory Controller

Figure 3:
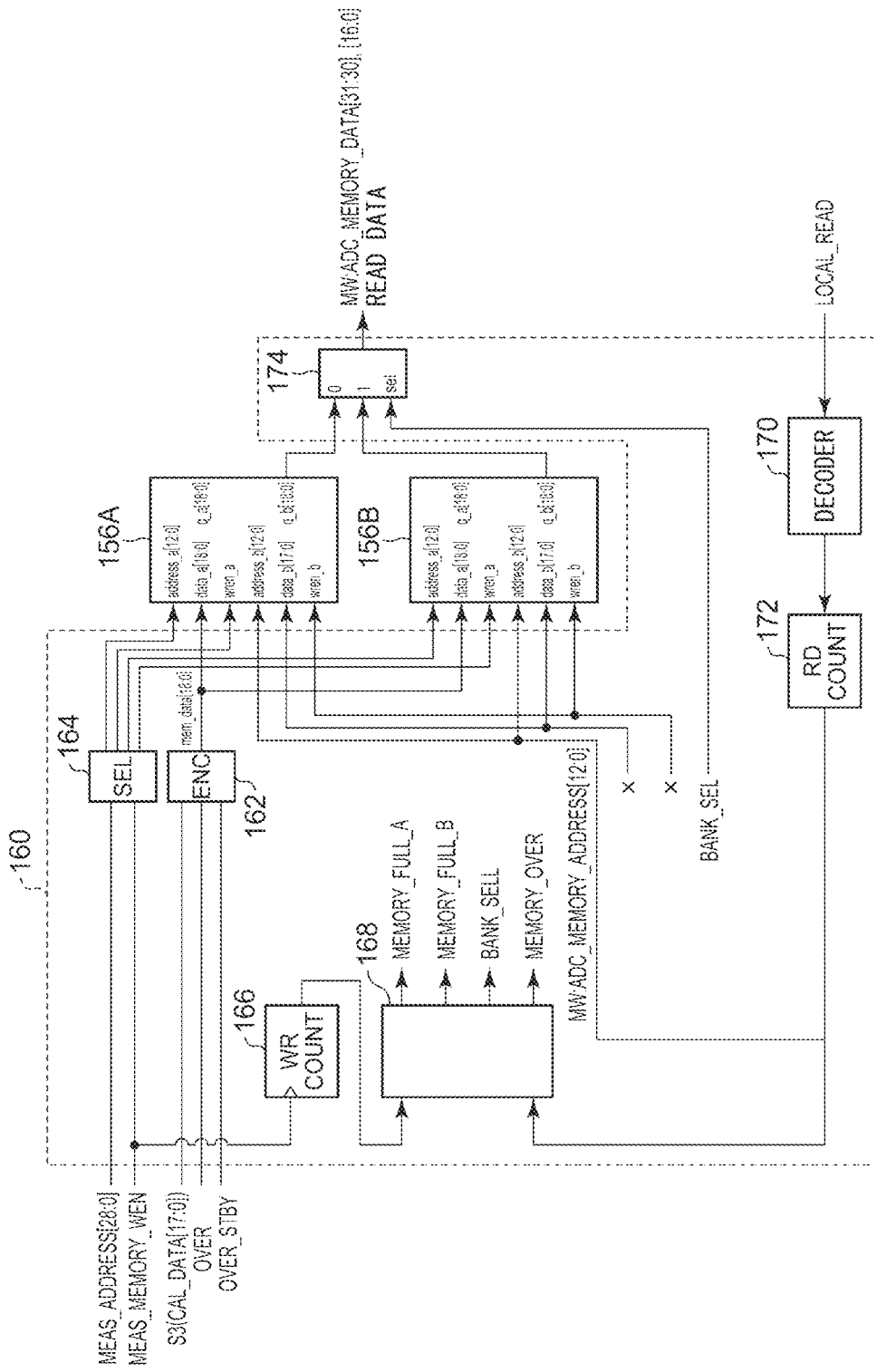
FIG. 3 is a block diagram showing an example configuration of a memory controller, a first memory unit, and a second memory unit.

FIG. 3 is a block diagram showing an example configuration of the memory controller 160 and the memory units 156A and 156B. In this example, the memory units 156A and 156B are configured as dual-port memory designed with 19 bits per word. The memory units 156A and 156B are each configured to have a capacity of 8 k words.

Each memory unit 156 includes an address input address_a[12:0] for a port a, a data input data_a[18:0] for the port a, a write enable wren_a for the port a, an address input address_b[12:0] for a port b, a data input data_b[18:0] for the port b, and a write enable wren_b for the port b.

The memory controller 160 receives, as its input, digital data S3 from the signal processing unit 154. Furthermore, the memory controller 160 receives a write enable signal MEAS_MEMORY_WEN in synchronization with the digital data S3. The digital data S3 is configured as 18-bit data CAL_DATA[17:0]. The write enable signal MEAS_MEMORY_WEN is asserted every time the data CAL_DATA[17:0] is generated by the signal processing unit 154.

Furthermore, the memory controller 160 receives, as its input, a measurement address MEAS_ADDRESS[28:0]. The measurement address MEAS_ADDRESS[28:0] may indicate the number of times sampling is performed from the start of measurement.

Moreover, the memory controller 160 receives, as its input, error signals OVER and OVR_STBY from the signal processing unit 154. The error signal OVER is a flag that indicates that overflow has occurred in calculation executed by the signal processing unit 154 or that there is an overflow problem in the measurement data. On the other hand, the error signal OVR_STBY is a flag that indicates that overflow has occurred in the measurement executed by the A/D converter 152.

The memory controller 160 includes a write encoder 162, a write selector 164, a write counter 166, and a state machine 168, with respect to the data writing to the memory.

The write encoder 162 receives, as its input, the data CAL_DATA[17:0] and the error signals OVER and OVR_STBY, and generates 19-bit data mem_data[18:0] to be written to the memory units 156A and 156B. When no error has occurred, the data mem_data[18:0] includes the original data CAL_DATA[17:0] or data obtained by processing the original data CAL_DATA[17:0]. When an error has occurred, the data mem_data[18:0] includes a predetermined code.

The write selector 164 receives the measurement address MEAS_ADDRESS[28:0] and the measurement memory write enable signal MEAS_MEMORY_WEN. The measurement address MEAS_ADDRESS[28:0] is incremented every time the enable signal MEAS_MEMORY_WEN is asserted.

The write selector 164 selects the writing target memory unit (156A or 156B) based on the value of the lower 14-th bit MEAS_ADDRESS[13] of the measurement address MEAS_ADDRESS[28:0]. Specifically, when MEAS_ADDRESS[13] is set to 0, the memory unit 156A is selected. Conversely, when MEAS_ADDRESS[13] is set to 1, the memory unit 156B is selected. The write selector 164 supplies the lower 13-bit data MEAS_ADDRESS[13:0] of the measurement address MEAS_ADDRESS[28:0] to the address input address #[12:0] of the memory unit 156# thus selected. Furthermore, the write selector 164 supplies the write enable signal MEAS_MEMORY_WEN to the write enable wren_# of the memory unit 156# thus selected.

With this arrangement, the measurement data CAL_DATA is written to an appropriate memory unit (bank) every time new measurement data CAL_DATA is generated.

The write counter 166 monitors the write enable signal MEAS_MEMORY_WEN, and counts the number of writing operations. The count value is supplied to the state machine 168.

When a given memory unit 156#, which serves as the current writing target, has become full, the state machine 168 asserts a flag MEMORY_FULL_# that indicates that the corresponding memory unit has become full.

The above is the configuration with respect to the data writing operation of the memory controller 160. Next, description will be made regarding a configuration with respect to the data reading operation. The memory controller 160 includes a command decoder 170, a read counter 172, and an output selector 174, with respect to the data reading operation.

The command decoder 170 receives a control signal (command) from the module interface 180, and decodes the control signal thus received. Upon receiving the local read command LOCAL_READ, the command decoder 170 reads data from the memory unit 156# that has become full after the data has been written. The read counter 172 counts the number of times the data has been read. The count value of the read counter 172 is supplied to the address input address_b[12:0] of the port b of the memory unit 156# as the address signal MW:ADC_MEMORY_ADDRESS[12:0] for the memory unit 156#. With this arrangement, data is sequentially read in units of one word from the start address toward the last address of the memory unit 156#. The output selector 174 receives data of outputs q_b of the memory units 156A and 156B, and selects one of the outputs according to the bank select signal BANK_SEL. The bank select signal BANK_SEL is a flag that indicates the memory that has become full in the current stage (i.e., the bank from which the data is to be read). When the bank select signal BANK_SEL is set to "0", the memory unit 156A is selected. When the bank select signal BANK_SEL is set to "1", the memory unit 156B is selected.

Furthermore, the count value of the read counter 172 is supplied to the state machine 168. The state machine 168 refers to the count value of the read counter 172. When the data is read from all the addresses of the memory unit 156#, the state machine 168 negates the flag MEMORY_FULL_#. When the flag MEMORY_FULL_# has been negated, the state machine 168 toggles the BANK_SEL so as to switch the memory unit from which the data is to be read by the higher-level controller 110.

The state machine 168 monitors the two flags MEMORY_FULL_A and MEMORY_FULL_B. When both the two flags are asserted at the same time, the state machine 168 asserts a flag MEMORY_OVER_FLOW that indicates that data reading failure has occurred. The flag MEMORY_OVER_FLOW indicates that the next bank has become full in a state in which a given bank has become full. This is an error signal that indicates that data has been destroyed due to data overwriting the previous bank data.

Figure 4:
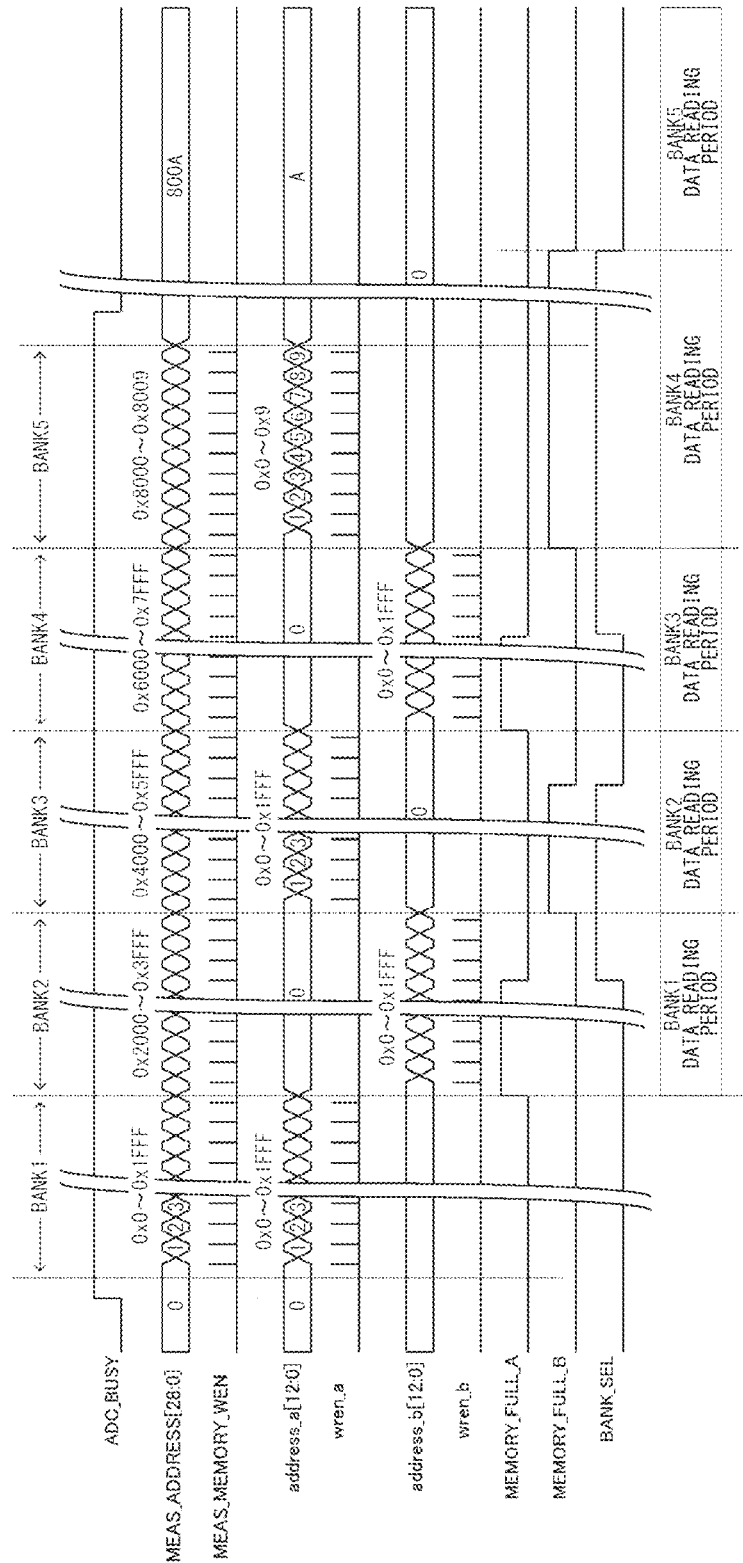
FIG. 4 is a time chart with respect to writing in memory access.

Next, description will be made regarding the memory access operation. FIG. 4 is a time chart with respect to the writing in the memory access operation. The number of the BANK is incremented by one for every switching. When the bank number is an odd number, this indicates that the memory unit 156A is to be selected as the writing target. On the other hand, when the bank number is an even number, this indicates that the memory unit 156B is to be selected as the writing target.

The measurement address MEAS_ADDRESS[28:0] is incremented by one. When the measurement address value is between 0x0 through 0x1FFF, data is written to the memory unit 156A. When the measurement address value is between 0x2000 through 0x3FFF, data is written to the memory unit 156B. When the measurement address value is between 0x4000 through 0x5FFF, data is written to the memory unit 156A. When the measurement address value is between 0x6000 through 0x7FFF, data is written to the memory unit 156B. When the measurement address value is between 0x8000 through 0x9FFF, data is written to the memory unit 156A.

When the data writing is completed for all the addresses 0x0 up to 0x1FFF of the memory unit 156A, the flag MEMORY_FULL_A is asserted. Furthermore, when the data reading operation by the higher-level controller 110 is completed for all the addresses, the flag MEMORY_FULL_A is negated. This operation is alternately repeated between the two memory units 156A and 156B.

Figure 5:
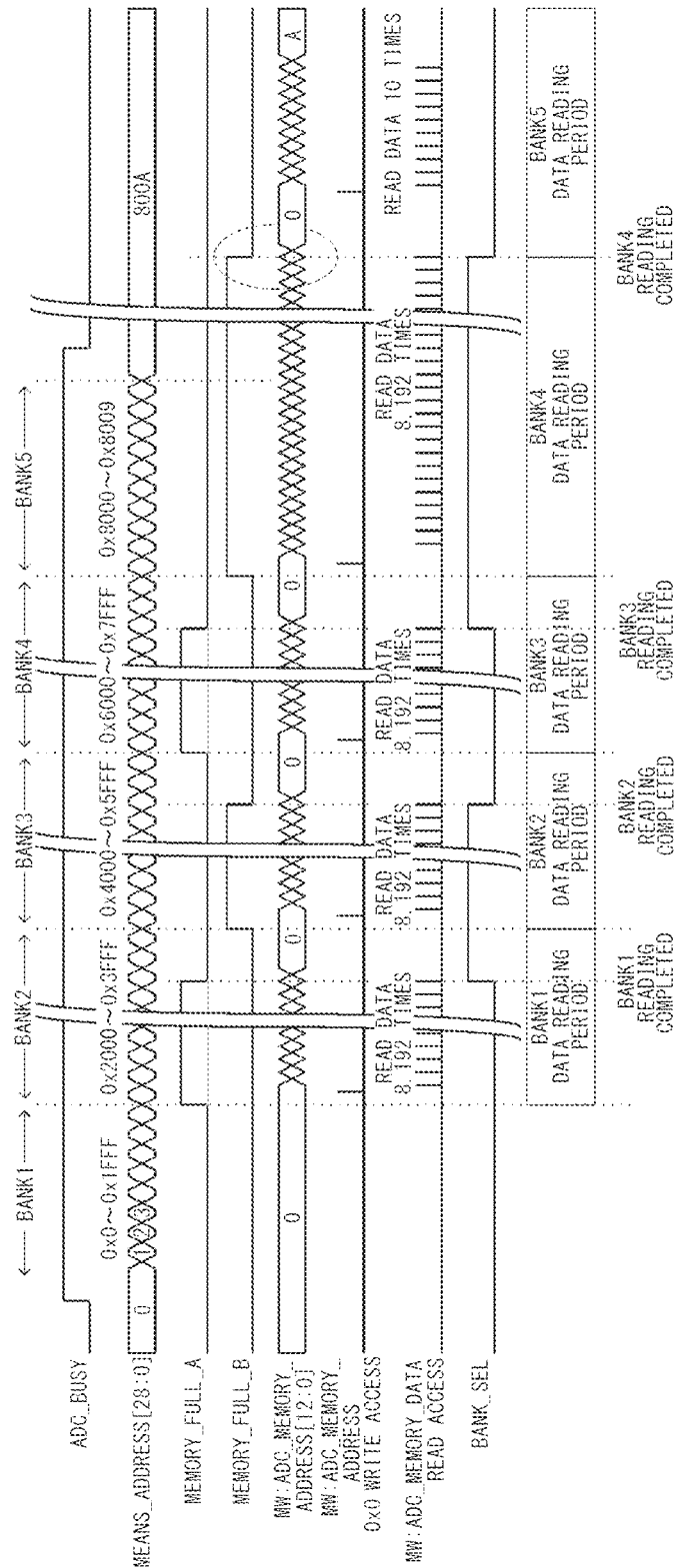
FIG. 5 is a time chart with respect to data reading.

FIG. 5 is a time chart with respect to the data reading operation. When the flag MEMORY_FULL_A is asserted, the higher-level controller 110 is notified of this assertion. The period of time from the assertion of the flag MEMORY_FULL_A up to the assertion of the next flag MEMORY_FULL_B is set as a data reading period in which the data is to be read from the memory unit 156A. The higher-level controller 110 must generate a read command so as to read all the data from the memory unit 156A within this period of time.

The read access is generated for the memory unit 156A in response to the read command generated by the higher-level controller 110. When the number of reading operations reaches 8192, i.e., the reading operation for all the addresses 0x0 up to 0x1FFF is completed, the flag MEMORY_FULL_A is negated. This operation is alternately repeated between the two memory units 156A and 156B.

Figure 6:
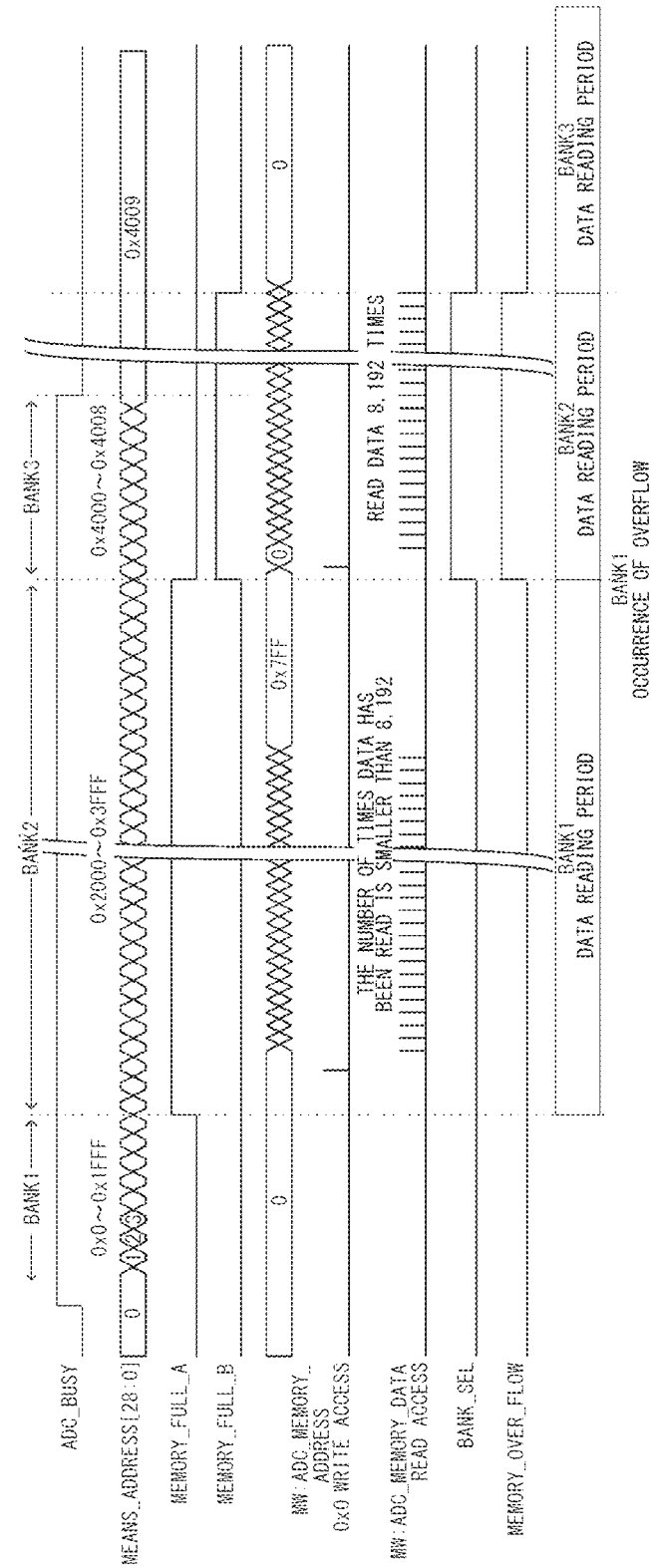
FIG. 6 is a time chart for explaining detection of memory overflow.

FIG. 6 is a time chart for explaining the detection of memory overflow. In this example, after the data writing to the memory unit 156A (BANK1) is completed, the flag MEMORY_FULL_A is asserted. Subsequently, a period of time up to the assertion of the flag MEMORY_FULL_B after the data writing to the memory unit 156B (BANK2) is completed is set as a data reading period for the BANK1. The number of times the data is read does not reach 8192 in the reading period, i.e., when the flag MEMORY_FULL_A is not negated in the reading period, the flag MEMORY_OVER_FLOW that indicates the overflow state is asserted.

Regarding the Bus Interface

The above is a description with respect to the local memory access. Next, description will be made regarding an interface between the waveform data acquisition module 140 and the higher-level controller 110.

Figure 7:
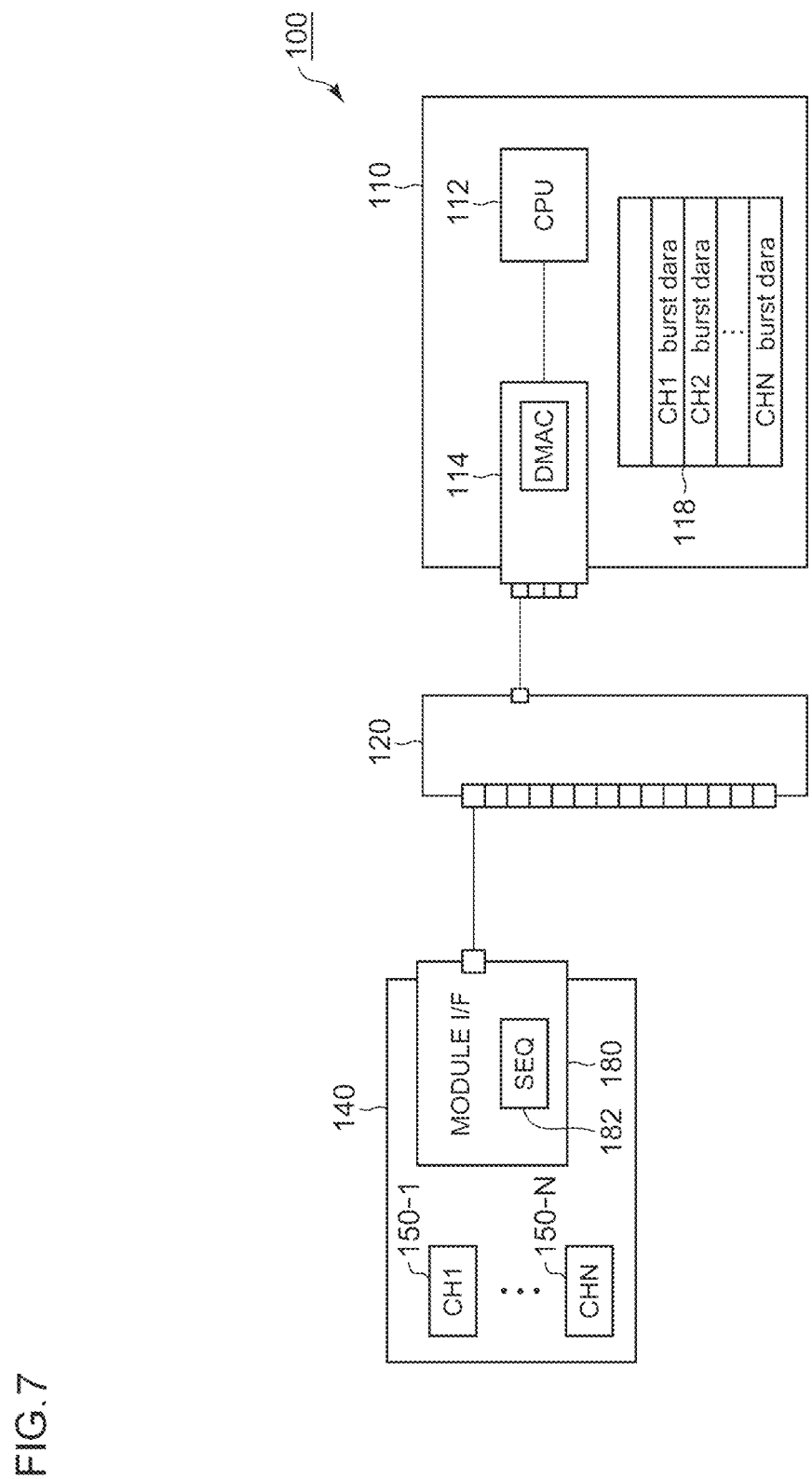
FIG. 7 is a block diagram showing a higher-level controller and a waveform data acquisition module.

FIG. 7 is a block diagram showing the higher-level controller 110 and the waveform data acquisition module 140. The higher-level controller 110 includes a CPU 112, a bus interface 114, and a memory unit 118. The bus interface 114 is configured as a PCI Express (trademark) card or the like, and includes a DMA (Direct Memory Access) controller 116. The DMA controller 116 accesses the waveform data acquisition module 140 according to a memory access command received from the CPU 112, and instructs the memory unit 118 to store the data thus read (burst transfer).

The module interface 180 transmits, to the CPU 112 via the bus interface 114, a notification of a particular channel of memory from among the multiple channels CH1 through CHN that has become full. For example, the CPU 112 manages the multiple channels CH1 through CHN in the form of several classified sets. With such an arrangement, upon detecting that the memory units of all the channels included in the same set have become full, the CPU 112 generates a read command (burst transfer command) for the memory units of all the channels included in the corresponding set. In response to the read command, the DMA controller 116 transmits a read command to the module interface 180.

The module interface 180 includes a sequencer 182. The sequencer 182 sequentially generates the local read command LOCAL_READ to the capture units 150 of the multiple channels designated by the read command READ received from the DMA controller 116. For example, when the read command transmitted from the DMA controller 116 is a read command for designating CH1 through CH4, the sequencer 182 sequentially generates a local read command for CH1 through CH4. As a result, data read for each channel is sequentially transmitted to the bus interface 114. The DMA controller 116 instructs the memory unit 118 to store, at the corresponding address, the data thus read for each channel.

Conventional burst transfer does not support data transfer across multiple channels. However, by providing the module interface 180 with the sequencer 182, such an arrangement is capable of supporting the burst transfer for multiple channels thus designated.

Figure 8:
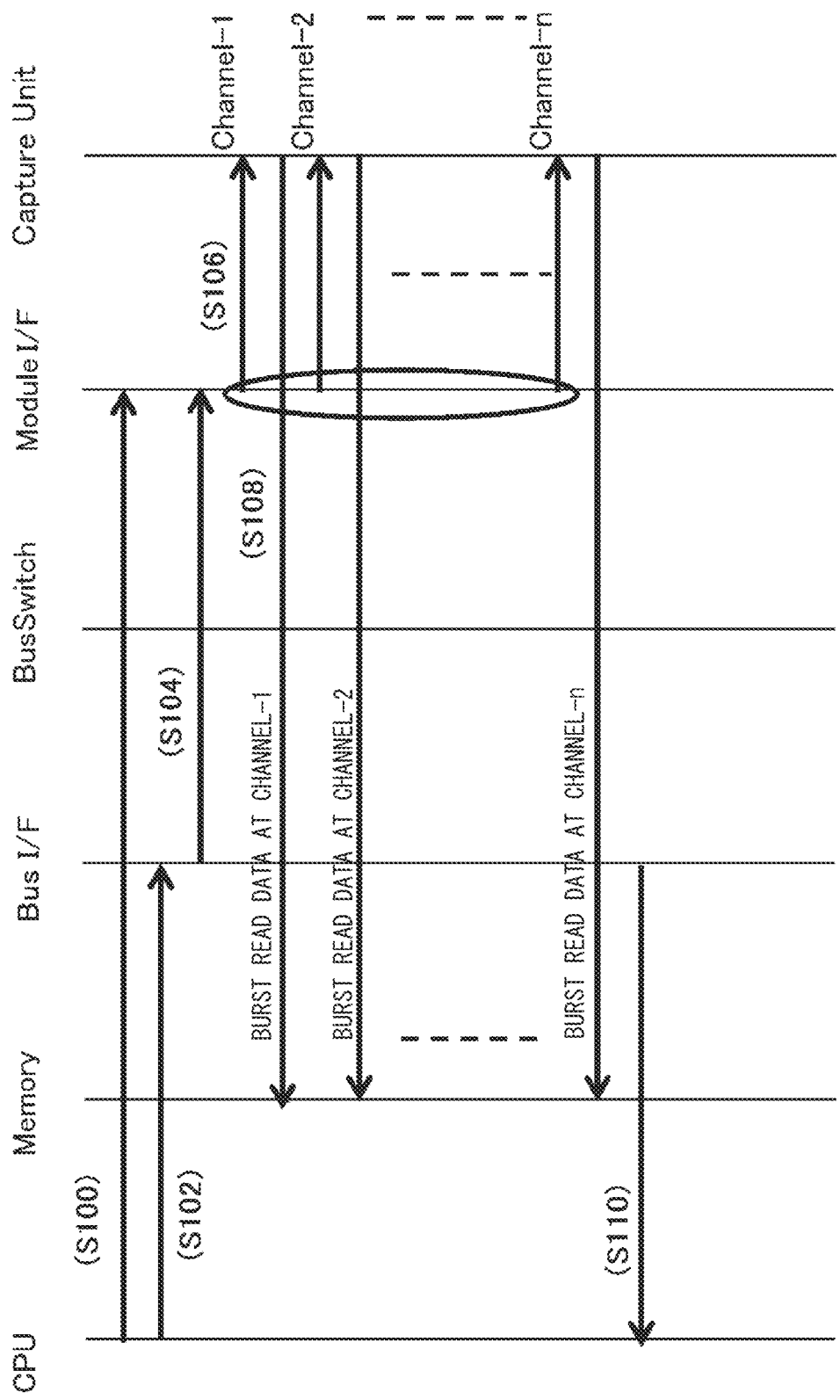
FIG. 8 is a sequence diagram for explaining the data access between the higher-level controller and the waveform data acquisition module.

FIG. 8 is a sequence diagram for explaining data access between the higher-level controller 110 and the waveform data acquisition module 140. First, the CPU 112 designates the number of the waveform data acquisition module 140 to be accessed and the channel numbers. The bus switch 120 is switched according to the number of the waveform data acquisition module 140 to be accessed. Furthermore, the channel numbers are transmitted to the waveform data acquisition module 140 (S100).

Subsequently, a startup instruction is supplied to the DMA controller 116 (S102). The DMA controller 116 outputs a read command to the module interface 180 (S104). The sequencer 182 of the module interface 180 sequentially issues a local read command for the designated channels (all the channels CH1 through CHN in this example) (S106). In response to the read command issued for each channel, data is burst transferred to the memory unit 118 of the higher-level controller 110 (S108). After the data transfer has been completed for all the channels, a DMA end interrupt is output from the bus interface 114 to the CPU 112 (S110).

Direct Interrupt

Next, description will be made regarding various kinds of notifications transmitted from the waveform data acquisition module 140 to the higher-level controller 110. The waveform data acquisition module 140 transmits, to the higher-level controller 110 by means of an interrupt, a memory full notification, a memory overflow notification, and an end of waveform measurement notification. This interrupt may be supported as a notification using a legacy interrupt line. However, in the present embodiment, such information is transmitted to the higher-level controller 110 by means of a different interrupt (which will be referred to as "direct interrupt" hereafter).

With the direct interrupt, the memory full information, the memory overflow information, and the notification of the end of waveform measurement are packetized and transmitted to the higher-level controller 110.

Figure 9:
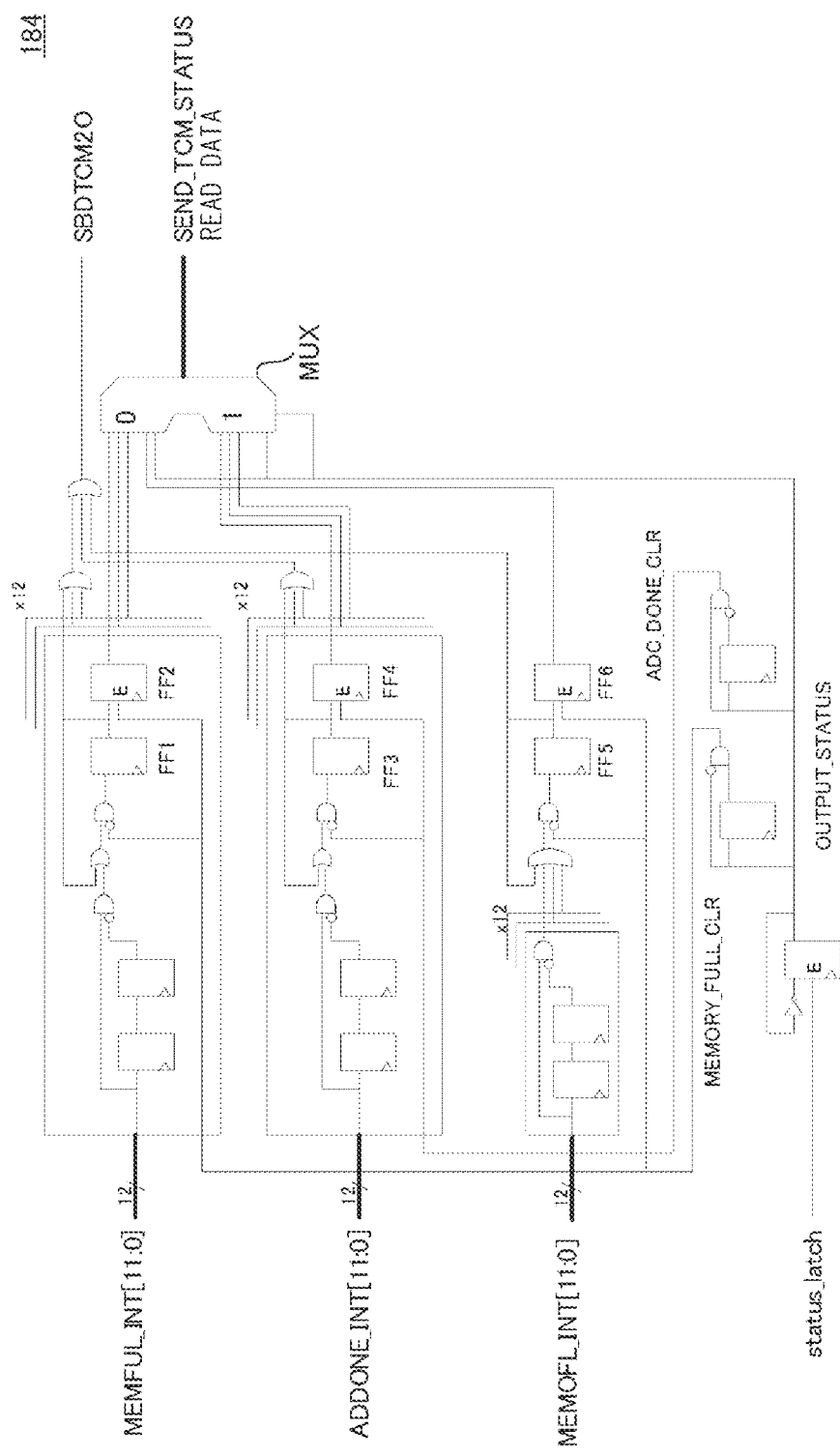
FIG. 9 is a block diagram with respect to the generation of direct interrupt packets.

FIG. 9 is a block diagram with respect to the generation of direct interrupt packets. The multiple channels CH1 through CHN are divided for every 12 channels. Each set of twelve channels will be referred to as "one split". A packet generating unit 184 that generates an interrupt packet is provided to the module interface 180 for each split. In a case in which the number of channels N is 96, eight (8=96/12) packet generating units 184 are provided.

The packet generating unit 184 receives, as its inputs, interrupt data MEMFUL_INT[11:0] configured as an information set that represents the memory full flags MEMORY_FULL_A and MEMORY_FULL_B for twelve channels, interrupt data ADDONE_INT[11:0] configured as an information set that represents the waveform measurement end flags for twelve channels, and interrupt data MEMOFL_INT[11:0] configured as an information set that represents the memory overflow flags MEMORY_OVER_FLOW for twelve channels. The interrupt data MEMFUL_INT[i] may be configured as the logical OR of the two flags MEMORY_FULL_A and MEMORY_FULL_B for the corresponding channel CHi.

The packet generating unit 184 generates packet data SEND_TCM_STATUS and a status flag SBDTCM2O. When "1" is set to any bit of the interrupt data MEMFUL_INT[11:0], ADDONE_INT[11:0], and MEMOFL_INT[11:0], the status flag SBDTCM2O is asserted.

In the memory unit 118 of the higher-level controller 110, a dedicated interrupt address is prepared. The module interface 180 writes packet data SEND_TCM_STATUS to the dedicated interrupt address. The CPU 112 of the higher-level controller 110 monitors the dedicated interrupt address. Immediately upon detecting an interrupt, the CPU 112 acquires an interrupt factor or the like.

The interrupt data is configured as MEMFUL_INT[11:0], ADDONE_INT[11:0], and MEMOFL_INT[11:0], which are a total of 36 bits of data. In a case in which all the bits of the 36 bits of data are packetized, this leads to a problem of a large packet size. Accordingly, this arrangement requires the packet data to be divided into multiple sub-packets before the data transmission. In order to solve such a problem, the packet generating unit 184 calculates the logical OR of all the bits of the interrupt data MEMOFL_INT[11:0] that indicates the memory overflow state so as to generate one-bit data. The packet data SEND_TCM_STATUS is designed to include the one-bit data thus generated.

Furthermore, the interrupt data MEMFUL_INT[11:0] and ADDONE_INT[11:0] are alternately selected as the interrupt data to be included in the packet data SEND_TCM_STATUS every time an interrupt packet is transmitted. Moreover, the packet data SEND_TCM_STATUS includes a flag OUTPUT_STATUS that indicates the interrupt data included in the current stage in the packet data SEND_TCM_STATUS from among MEMFUL_INT[11:0] and ADDONE_INT[11:0]. The one-bit MEMOFL data is transmitted together with MEMFUL_INT[11:0].

The output status OUTPUT_STATUS is toggled every time a status latch signal status_latch is generated. When OUTPUT_STATUS=0, this indicates a state in which MEMFUL_INT is supplied as a notification. Conversely, when OUTPUT_STATUS=1, this indicates a state in which ADDONE_INT is supplied as a notification.

A MEMORY_FULL_CLR signal is asserted every time a negative edge occurs in OUTPUT_STATUS. The value (status of MEMORY_FULL) of a flip-flop FF2 is decided in response to the assertion of the MEMORY_FULL_CLR signal, which is output to a multiplexer MUX configured as a downstream stage. Furthermore, the value of a flip-flop FF1 is set to 0 in response to the assertion of the MEMORY_FULL_CLR signal, which clears the interrupt factor relating to MEMORY_FULL.

The MEMORY_FULL_CLR signal is also supplied to flip-flops FF5 and FF6. The value of the flip-flop FF6 (status of MEMORY_OVER_FLOW) is decided in response to the assertion of the MEMORY_FULL_CLR signal, which is output to the multiplexer MUX configured as a downstream stage. Furthermore, the value of the flip-flop FF5 is set to 0 in response to the assertion of the MEMORY_FULL_CLR signal, which clears the interrupt factor relating to MEMORY_OVER_FLOW.

An ADC_DONE_CLR signal is asserted every time a positive edge occurs in OUTPUT_STATUS. The value of the flip-flop FF4 (status of ADC_DONE) is decided in response to the assertion of the ADC_DONE_CLR signal, which is output to the multiplexer MUX configured as a downstream stage. Furthermore, the value of a flip-flop FF3 is set to zero in response to the assertion of the ADC_DONE_CLR signal, which clears the interrupt factor relating to ADC_DONE.

Figure 10:
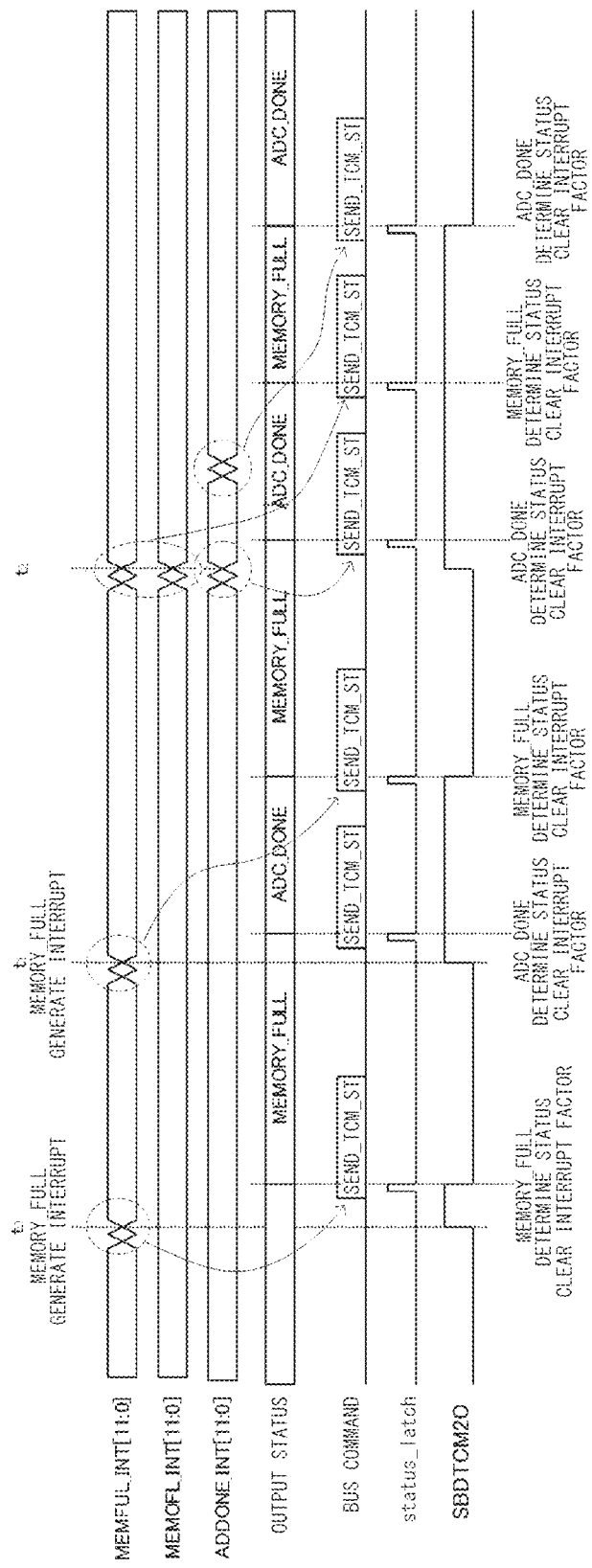
FIG. 10 is a diagram for explaining the operation of a packet generating unit shown in FIG. 9.

FIG. 10 is a diagram for explaining the operation of the packet generating unit 184 shown in FIG. 9. When "1" is set for any one of the bits of MEMFUL_INT[11:0] at the time point to, the flip-flop FF1 of the corresponding channel stores "1", which sets the SBDTCM2O signal to the high level. Subsequently, a bus command is generated for transmitting the SEND_TCM_STATUS packet, and the status_latch signal is asserted. In response to a negative edge of the status latch signal, the output status is switched to MEMORY_FULL and the MEMORY_FULL_CLR signal is asserted. This sets the value of the flip-flop FF1 (and FF5) to "0", which clears the interrupt factor of MEMORY_FULL. Furthermore, the output of the flip-flop FF2 is input to the multiplexer MUX together with the output of the flip-flop FF5, which is stored in the SEND_TCM_STATUS packet.

When "1" is set again for any one of the bits of MEMFUL_INT[11:0] at the time point $t_1$, "1" is stored in the flip-flop FF1 of the corresponding channel, and the SBDTCM2O signal is set to the high level. Subsequently, a bus command is generated for transmitting the SEND_TCM_STATUS packet, and the status_latch signal is asserted. In response to a negative edge of the status_latch signal, the output status is switched to ADC_DONE, and the ADC_DONE_CLR signal is asserted. When the ADC_DONE_CLR signal is asserted, the output of FF4 is input to the multiplexer MUX, and is stored in the SEND_TCM_STATUS packet. Subsequently, the SEND_TCM_STATUS packet thus processed is transmitted. It should be noted that this packet includes no information with respect to MEMORY_FULL which indicates the interrupt factor to be transmitted.

When the ADC_DONE_CLR signal is asserted, the value of the flip-flop FF1 (i.e., interrupt factor of MEMORY_FULL) is not cleared. Accordingly, the SBDTCM2O signal is maintained at the high level. Accordingly, the bus command SEND_TCM_STATUS is generated again, and the status latch signal is asserted. In response to a negative edge of the status_latch signal, the output status is switched to MEMORY_FULL, and the MEMORY_FULL signal is asserted. In this state, the packet SEND_TCM_STATUS including the information with respect to MEMORY_FULL is generated and transmitted. Furthermore, the flip-flop FF1 is cleared, and the SBDTCM2O signal is set to the low level.

At the time point $t_2$, all the interrupt factors, i.e., MEMORY_FULL, MEMORY_OVER_FLOW, and ADC_DONE, are generated, and the SBDTCM2O signal is set to the high level. In response to the subsequent bus command SEND_TCM_ST, an interrupt relating to ADC_DONE is transmitted to the higher-level controller 110, and the interrupt factors are cleared.

At the time point $t_3$, when "1" is set for any one of the bits of ADC_DONE[11:0], the flip-flop FF3 of the corresponding channel stores "1".

In response to the subsequent bus command SEND_TCM_ST, an interrupt relating to MEMORY_FULL is transmitted to the higher-level controller 110, and the interrupt factors are cleared.

In this state, a new interrupt factor that occurs at the time point $t_3$ remains. Accordingly, the SBDTCM2O signal is maintained at the high level. Subsequently, in response to the next bus command SEND_TCM_ST, an interrupt relating to ADC_DONE is transmitted to the higher-level controller 110, and the interrupt factor is cleared.

The above is a description of the direct interrupt. Next, description will be made regarding an advantage of the direct interrupt. With a conventional interrupt, the CPU is required to monitor an interrupt signal. Upon detecting an interrupt, the CPU is required to access the waveform data acquisition module 140 to read the interrupt factor, which involves large overhead.

In contrast, with the present embodiment, upon receiving a direct interrupt, the CPU 112 of the higher-level controller 110 checks the content of the packet SEND_TCM_STATUS. Such an arrangement is capable of acquiring direct information with respect to the channel at which an interrupt factor has occurred and the content of the interrupt factor. Accordingly, this arrangement supports notification with a higher speed than that of a conventional interrupt.

Error Detection

Description will be made with reference to FIG. 7. When the bus interface 114 does not receive the data within a predetermined period of time after a read command is issued to the waveform data acquisition module 140, the reading processing is discontinued, and an error interrupt is applied to the CPU 112.

When the data is not output from the capture unit 150 within a predetermined period of time after a local read command has been issued, the module interface 180 discontinues the reading processing. After the module interface 180 discontinues the processing, this stops data transmission to the bus interface 114 of the higher-level controller 114. As a result, the bus interface 114 does not receive the data within a predetermined period of time, which applies an error interrupt to the CPU 112.

Next, description will be made regarding an architecture for acquiring the waveform data of an analog signal such as a power supply current, power supply voltage, or the like, in a form associated with the progress of a pattern program.

Figure 11:
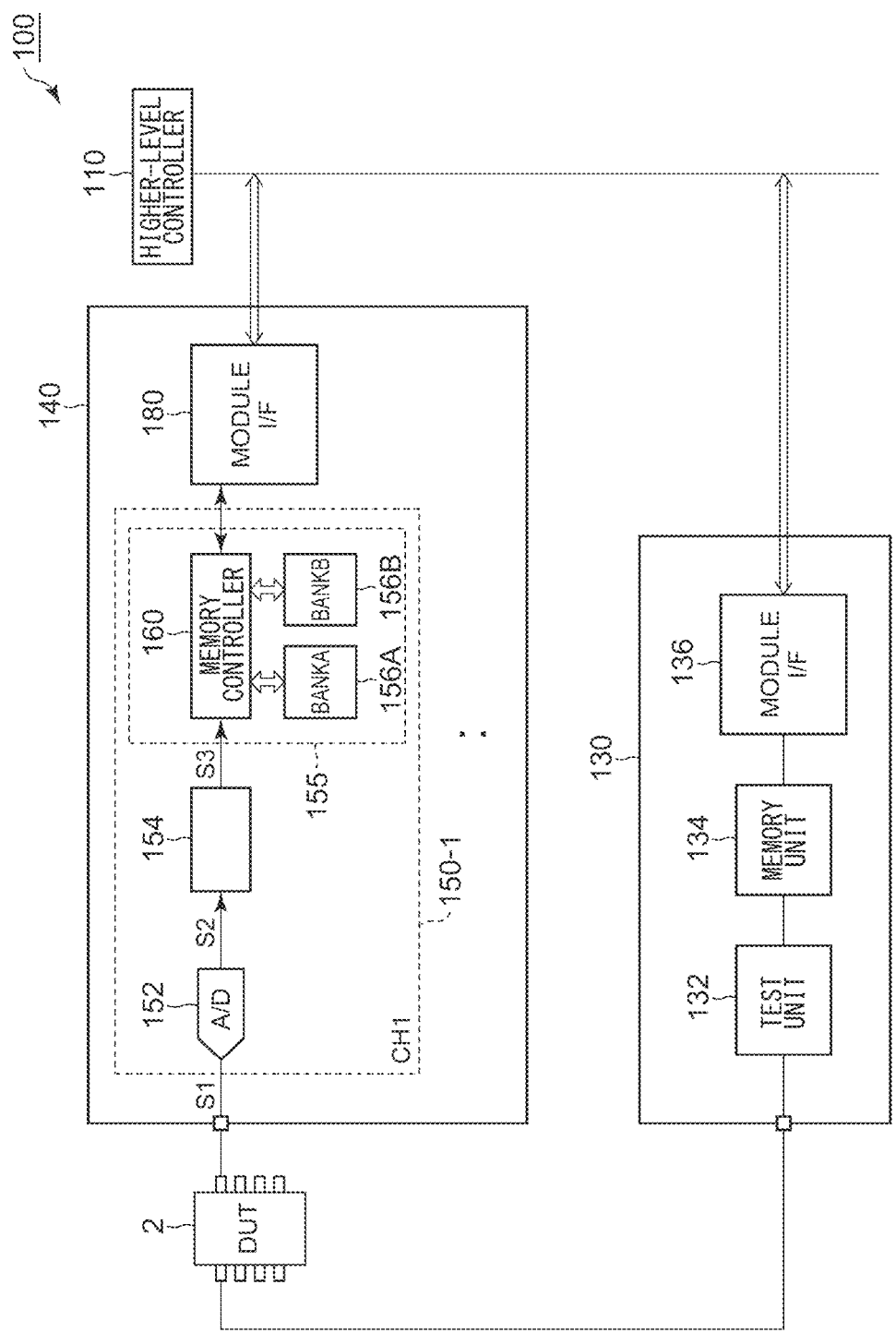
FIG. 11 is a block diagram showing the test apparatus.

FIG. 11 is a block diagram showing the test apparatus 100. As described above, the test apparatus 100 is configured as a multi-channel test apparatus. For simplification of description, FIG. 11 shows only a single-channel configuration.

The test apparatus 100 includes the higher-level controller 110, the waveform data acquisition module 140, and the function test module 130.

The waveform data acquisition module 140 includes an A/D converter 152, a signal processing unit 154, a first memory unit 155, and a module interface 180. The A/D converter 152 is configured as a digitizer that converts an electrical signal S1 (e.g., a power supply voltage or power supply current) relating to the DUT 2 into a digital signal S2 with a predetermined sampling rate $F_S$.

The signal processing unit 154 performs signal processing of the digital signal S2 as necessary, which is the output of the A/D converter 152. The content of the signal processing is not restricted in particular. Examples of such signal processing include calibration processing.

The first memory unit 155 stores the waveform data configured as a sequence of the digital data S3 obtained based on the digital signal S2 by means of the A/D converter 152. The first memory unit 155 may be configured as the architecture described with reference to FIG. 2. Specifically, the first memory unit 155 may include the memory controller 160 and the memory units 156A and 156B configured as two banks.

The module interface 180 is configured as an interface with the higher-level controller 110.

The function test module 130 includes a test unit 132, a second memory unit 134, and a module interface 136. The test unit 132 executes a pattern program for the DUT 2. The pattern program is configured as a sequential execution list of PG commands each specifying a combination (test pattern or test vector) of signals (I/O) to be supplied to the DUT 2 and a combination of signals (expected values) to be returned from the DUT 2 in response to the signals thus supplied. In addition, the pattern program is configured as a combination with additional PG commands for generating a conditional branch, waiting, trigger, or the like.

The configuration of the test unit 132 is not restricted in particular. For example, the test unit 132 includes a driver DR that supplies a test pattern specified in the pattern program to the DUT 2, a receiver that receives a signal output from the DUT 2 in response to the test pattern thus supplied, a comparator that compares the signal thus received by the receiver with its expected value so as to judge whether or not the output signal matches its expected value, and the like.

The second memory unit 134 records the judgment results obtained by the test unit 132. The module interface 136 is configured as an interface with the higher-level controller 110.

The higher-level controller 110 controls the waveform data acquisition module 140 and the function test module 130, and collects the data acquired by the waveform data acquisition module 140 and the function test module 130.

Figure 12:
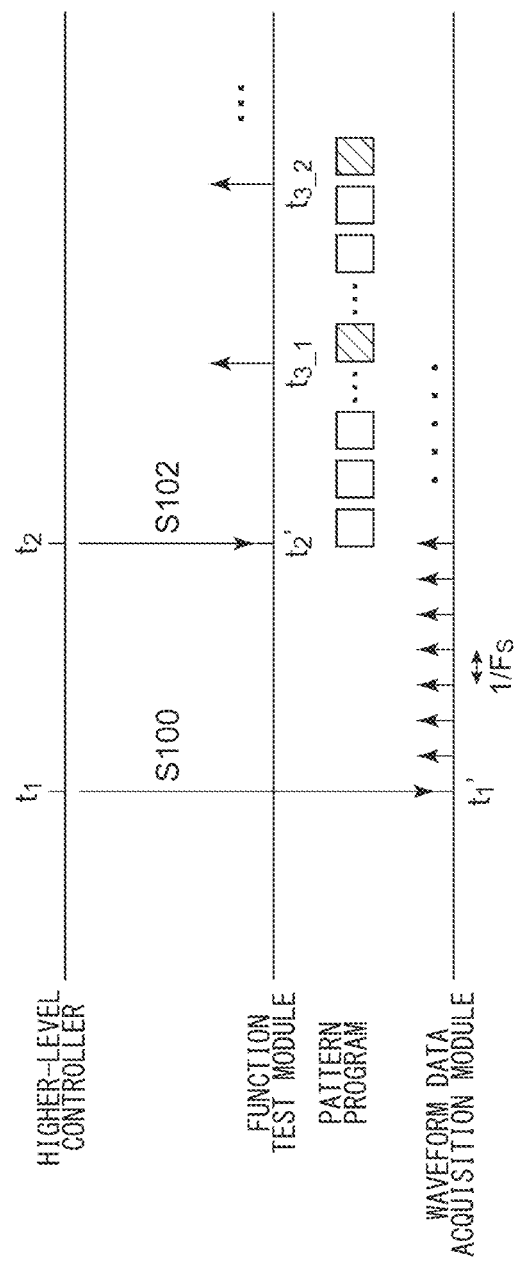
FIG. 12 is a time chart for explaining the operation of the test apparatus shown in FIG. 11.

FIG. 12 is a time chart for explaining the operation of the test apparatus 100 shown in FIG. 11. The higher-level controller 110 instructs the waveform data acquisition module 140 to start the data sampling (S100). Furthermore, the higher-level controller 110 holds a time stamp of the time point $t_1$. The time point $t_1$ is generated based on the time management function supported by the higher-level controller 110.

When the module interface 180 of the waveform data acquisition module 140 receives a sampling start instruction (S100), the first memory unit 155 records the time stamp of the time point $t_1'$ at which the data sampling has been started.

The time point $t_1'$ is not transmitted from the higher-level controller 110. Instead, the time point $t_1'$ is generated based on the local time management function supported by the waveform data acquisition module 140.

Furthermore, the higher-level controller 110 instructs the function test module 130 to start the execution of a pattern program (S102). Moreover, the higher-level controller 110 holds the time stamp of the time point $t_2$. When the module interface 136 of the function test module 130 receives an instruction to start the execution of the pattern program (S102), the second memory unit 134 records the time stamp of the time point $t_2$ at which the pattern program has been executed. The time point $t_2$ is generated based on the local time management function supported by the function test module 130.

In a case in which the pattern program does not include conditional branching or waiting, only the time point at which the pattern program is started may be recorded. With such an arrangement, each subsequent time point at which the corresponding command is executed can be estimated. However, in actuality, in many cases, the pattern program includes such conditional branching, looping, or waiting. In this case, in addition to the time point $t_2$, the second memory unit 134 records the time stamps of the time points $t_{3\_1}$, $t_{3\_2}$, . . . at which the commands at the predetermined addresses (indicated by hatched regions in FIG. 12) included in the pattern program have been executed. This arrangement allows the waveform to be associated with the progress of the pattern program.

The command to be recorded as the time stamp can be specified by the user. The pattern program may be provided with an additional command for recording a time stamp of the time point at which a specified address command is executed. Alternatively, the user may prepare a list that differs from the pattern program, in order to specify a position (address of pattern program) to be recorded as a time stamp. The function test module 130 may be configured to read the list so as to record the time stamp.

Also, the second memory unit 134 may record the input value immediately after or immediately before the execution of a command every time the commands of the predetermined addresses $ADR_1$, $ADR_2$, . . . are each executed. As the input value to the DUT 2, a test vector or a test pattern may be employed. Also, other control parameters may be employed.

The second memory unit 134 may record an identifier $IDi$ that indicates the kind of each event $EVT_i$ (i=1, 2, . . . ) every time predetermined events $EVT_1$, $EVT_2$, . . . occur. Examples of the event EVT may be abnormality detection supported by the function test module 130.

The higher-level controller 110 accesses the first memory unit 155 at an appropriate timing so as to read the waveform data and the start time point $t_1'$.

Furthermore, the higher-level controller 110 accesses the second memory unit 134 at an appropriate timing, so as to read the data generated by the test unit 132, the start time point $t_2'$, or the execution time point $t_3$ at which a predetermined command is executed.

The A/D converter 152 operates with a known sampling rate $F_S$. The time point $t_j'$ on the local time axis of the waveform data acquisition module 140, at which the j-th data of the waveform data is acquired, can be represented by the following Expression.

$$t_j' = t_1' + j \times 1/F_S$$

The higher-level controller 110 aligns the local time point $t_1'$ of the waveform data acquisition module with the time point $t_1$ on the time axis of the higher-level controller. With this arrangement, the time point $t_j$ at which the j-th data occurs in the waveform data on the time axis of the higher-level controller 100 can be represented by the following correction Expression.

$$t_j = t_1 + j \times 1/F_S$$

Furthermore, by aligning the local time point $t_2'$ of the function test module with the time point $t_2$ of the higher-level controller, such an arrangement is capable of associating the waveform data with the progress of the function test.

Figure 13:
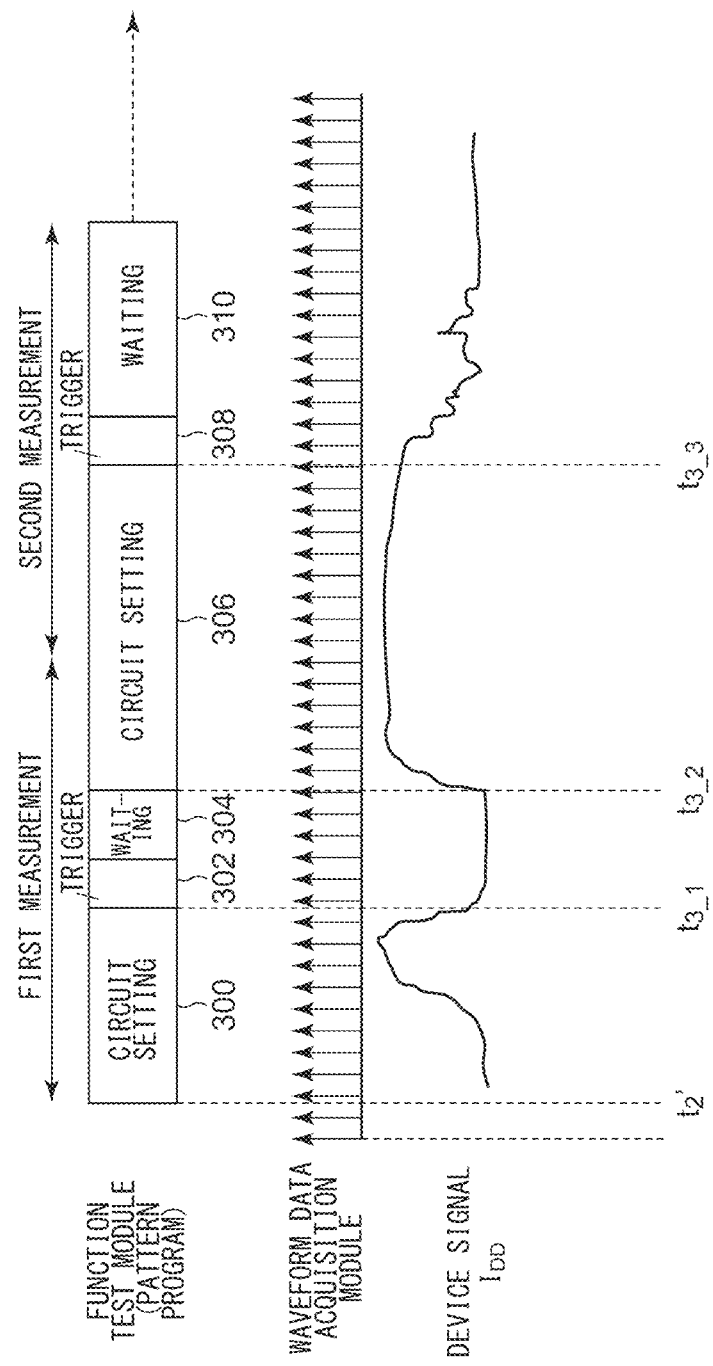
FIG. 13 is a diagram showing an example of the correspondence relation between the waveform data acquired by the test apparatus and a PG command defined by a pattern program employed in a function test module.

FIG. 13 is a diagram showing an example of the correspondence relation between the waveform data of the power supply current $I_{DD}$ obtained by the test apparatus 100 and the PG commands provided by the pattern program.

Let us consider a case in which the power supply current $I_{DD}$ is measured while switching the state of the DUT 2. The time point $t_2'$ is the start time point at which the pattern program is started. The pattern program is sequentially executed from the start address. With such an arrangement, a PG command group 300 is executed for setting the state so as to set the internal state of the DUT 2 to a first state. After the execution of the PG command group 300, a measurement trigger command 302 is executed. Typically, such a trigger command 302 is an instruction to start to measure (start to acquire) the power supply current $I_{DD}$. However, with the present embodiment, it should be noted that the power supply current $I_{DD}$ is continuously sampled even before the trigger command 302. Subsequently, a waiting command 304 is executed, which is an instruction to wait until the measurement is completed. After the execution of the waiting command 304, the measurement of the power supply current $I_{DD}$ in the first state is completed.

Subsequently, a PG command group 306 is executed for setting the DUT 2 to a second state, which switches the internal state of the DUT 2. After the execution of the command group 306 has been completed, a measurement trigger command 308 is executed so as to execute a waiting command 310. After the execution of the waiting command 310 is completed, the measurement of the power supply current $I_{DD}$ in the second state is completed.

In a case of executing such a test, time stamps that indicate the time points $t_{3\_1}$ and $t_{3\_3}$ at which the trigger commands 302 and 308 are executed may be recorded. By checking the time stamps after the measurement, such an arrangement allows judgment to be made regarding whether or not the DUT operated in a stable state, and whether or not the current has been acquired at an appropriate timing. Specifically, such an arrangement is capable of checking the waveform of the power supply current $I_{DD}$ at the corresponding time points based on the time stamps of the execution time points $t_{3\_1}$ and $t_{3\_3}$. In this example, it can be confirmed that the power supply current $I_{DD}$ was stable at the time stamp $t_{3\_1}$. Accordingly, it can be confirmed that the DUT operated in a stable state. On the other hand, the power supply current $I_{DD}$ varied in a transient manner at the time stamp $t_{3\_3}$. Accordingly, it can be confirmed that the DUT operated in an unstable manner, and that the power supply current $I_{DD}$ was measured at an inappropriate timing.

Furthermore, by recording the time stamp of the time point $t_{3\_2}$, such an arrangement allows the user to confirm whether or not an appropriate waiting time was applied by the waiting command to the trigger command 302. This information is useful when the pattern program is modified, e.g., when the setting time provided by the waiting command 304 is changed.

It should be noted that the waveform is shown in FIG. 13 for exemplary purposes only. Rather, the content of the pattern program to be executed and the commands for which the time stamps are to be recorded can be freely determined by the user.

With the test apparatus 100, as shown in FIG. 13, such an arrangement allows the waveform data to be associated with the commands (events) provided by the function test module 130 on the time axis. This provides information with respect to the behavior of an electrical signal to be monitored in a form associated with the corresponding step provided by the pattern program.

Description has been made above regarding an example in which the waveform data is acquired in synchronization with the pattern program in the DC test. Also, the present invention is applicable to various kinds of tests that differ from the DC test, examples of which include AC parametric tests, function tests, and margin tests. Specifically, such an arrangement allows the waveform data to be acquired in synchronization with the pattern program executed in such different tests.

For example, the waveform data acquisition module 140 may further include function blocks or IPs necessary for the AC parametric test or function test. In this case, the waveform data acquisition module 140 also functions as the corresponding test unit.

FIG. 13 shows only the waveform data acquired for a single DUT. However, the test apparatus 100 according to the present embodiment is capable of measuring multiple DUTs at the same time. Typically, in a case in which multiple DUTs are measured at the same time, the function test modules 130 assigned to the respective DUTs operate independently at different timings. With the test apparatus 100, the waveform data can be acquired from a large number of DUTs in a form associated with the pattern program that controls the DUTs.

Figure 14:
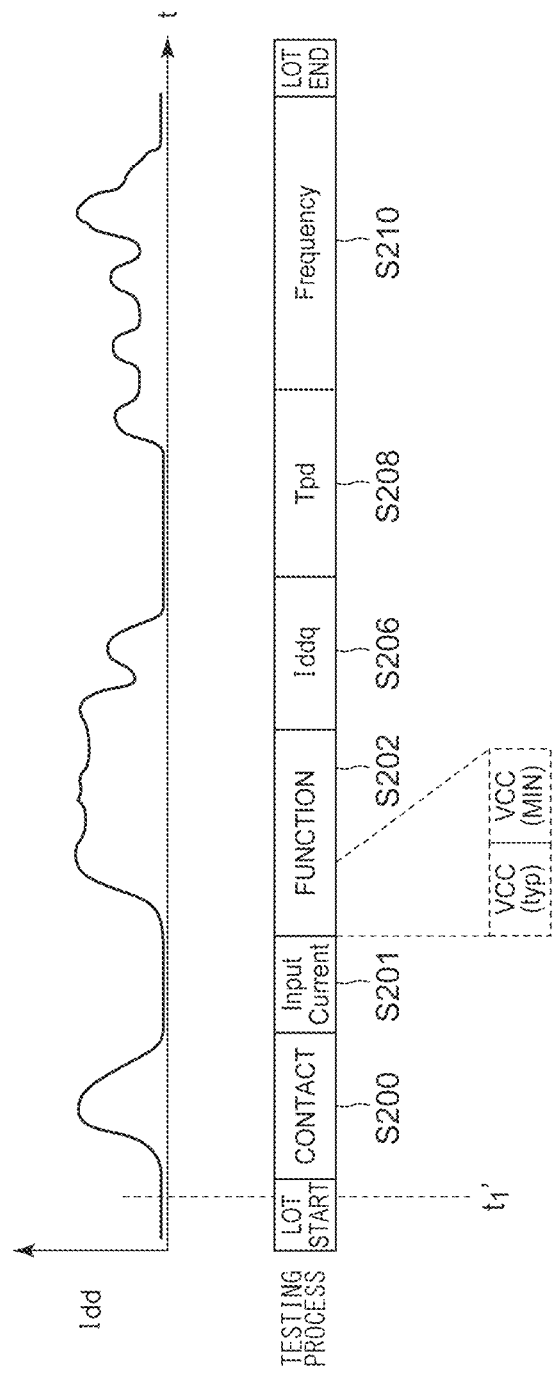
FIG. 14 is a diagram showing the relation between multiple test items and waveform data.

FIG. 14 is a diagram showing the relation between multiple test items and the waveform data. In this example, a contact test S200, input current test S201, function test S202, Iddq test S206, Tpd (input/output delay time) test 208, and frequency measurement test 210 are sequentially executed, following which the test ends.

The function test S202 includes multiple test items VCC (typ) and VCC(min). For example, the VCC(typ) item represents a test to be executed in a state in which the power supply voltage is set to a typical value in a specification sheet. The VCC(Min) item represents a test to be executed in a state in which the power supply voltage is set to the minimum voltage that guarantees operation.

A test start trigger is supplied from the higher-level controller 110 to the waveform data acquisition module 140. Upon receiving the trigger, the waveform data acquisition module 140 starts to acquire the waveform of the power supply current Idd, and records a time stamp $t_1'$.

The higher-level controller 110 executes the test plan, and supplies necessary triggers or control signals to the function test module 130 or the waveform data acquisition module 140. The higher-level controller 110 is capable of holding the time stamps that indicate the start time points or the end time points for each of the tests S200, S201, S202, S204, S206, S208, and S210.

In addition to the stamp of the time point $t_1'$ at which acquisition of the waveform is started, the first memory unit 155 may record a time stamp that indicates the time point at which an event occurs in an internal component of the waveform data acquisition module 140.

FIG. 14 shows only the waveform data acquired from a single DUT. Also, the test apparatus 100 is capable of measuring multiple DUTs at the same time. Typically, in a case of measuring multiple DUTs at the same time, the function test modules 130 operate independently of each other at different timings. With the test apparatus 100, the waveform data of each of a large number of DUTs can be acquired in a form associated with the corresponding steps of the function test (or the corresponding steps of other tests).

Figure 15:
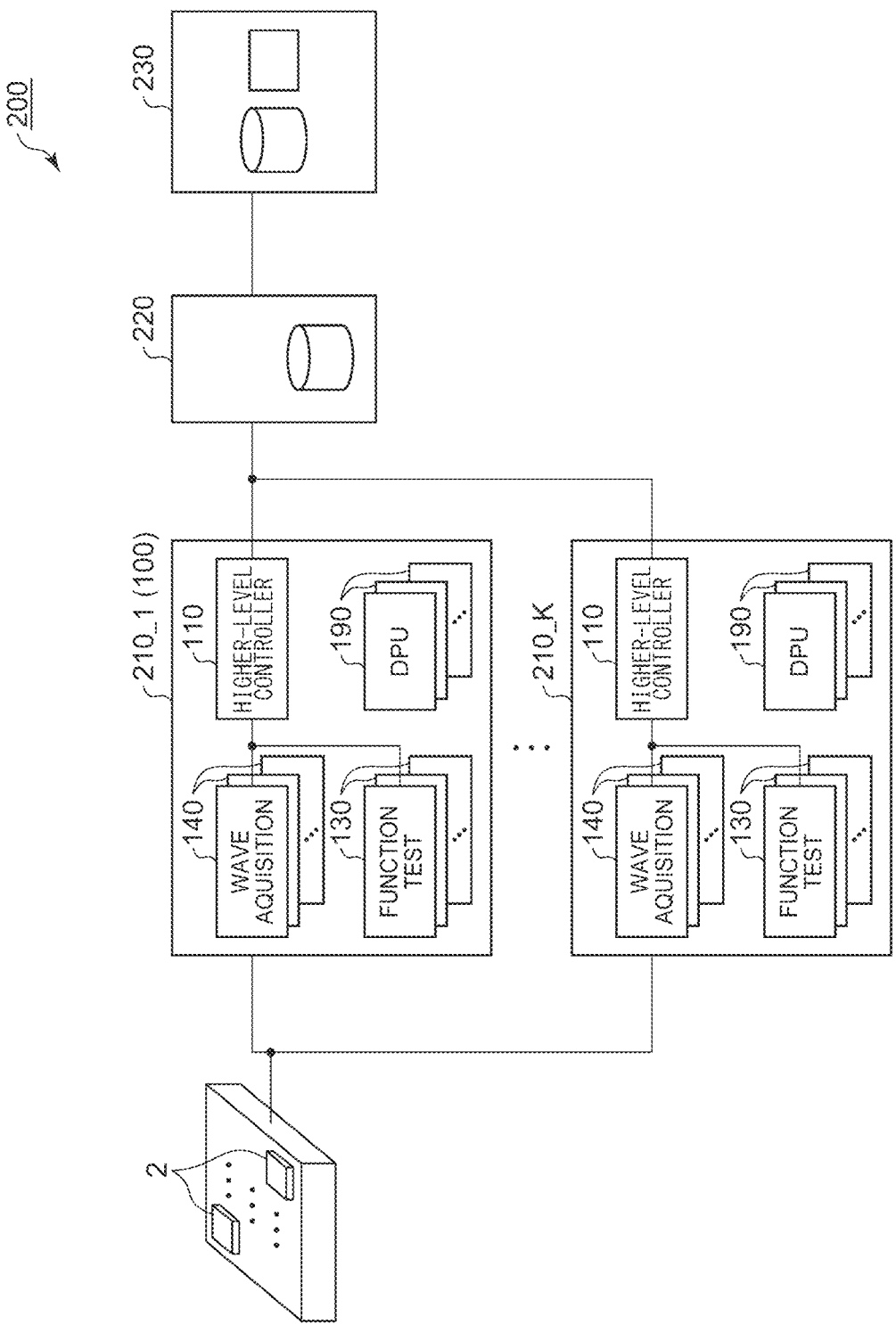
FIG. 15 is a block diagram showing a test system.

FIG. 15 is a block diagram showing a test system. The test system 200 includes multiple (K) test sites 210_1 through 210_K, a system controller 220, and a data server 230.

The test sites 210 correspond to the test apparatus 100 shown in FIG. 1. Each test site 210 includes multiple function test modules 130, multiple waveform data acquisition modules 140, multiple DC test units (DPUs) 190, and a higher-level controller 110.

Each test site 210 executes multiple test items such as a function test, DC test, or the like, using the function test modules 130 or the DPUs 190 according to the test program. Furthermore, the waveform data acquisition modules 140 respectively measure the waveforms of the power supply currents of the multiple DUTs during a period in which multiple test items are executed.

As described above, in each test site 210, the higher-level controller 110 reads the waveform data of the power supply currents of the multiple DUTs from the memory units (banks) of the multiple waveform data acquisition modules 140. As described above, such an arrangement is capable of continuously measuring the waveform data over a long period of time without involving time constraints. The higher-level controller 110 accumulates data with a part of the waveform data defined by the memory (bank) capacity as a unit.

The higher-level controller 110 executes necessary calculation processing every time the waveform data is read. After the calculation processing is completed, the higher-level controller 110 transmits the processed data to the system controller 220. For example, the higher-level controller 110 may convert the waveform data into spectrum data using an FFT (fast Fourier transform) method. The converted spectrum data may be transmitted to the system controller 220. However, the present invention is not restricted to such an arrangement.

Such an operation is repeated, thereby allowing each test site 210 to measure the power supply current over the entire period from the start up to the end of the test for each of the DUTs 2. This arrangement allows the system controller 220 to acquire the waveforms of the power supply currents for each of the multiple DUTs 2 from the multiple test sites 210_1 through 210_K over the entire test period.

Figure 16:
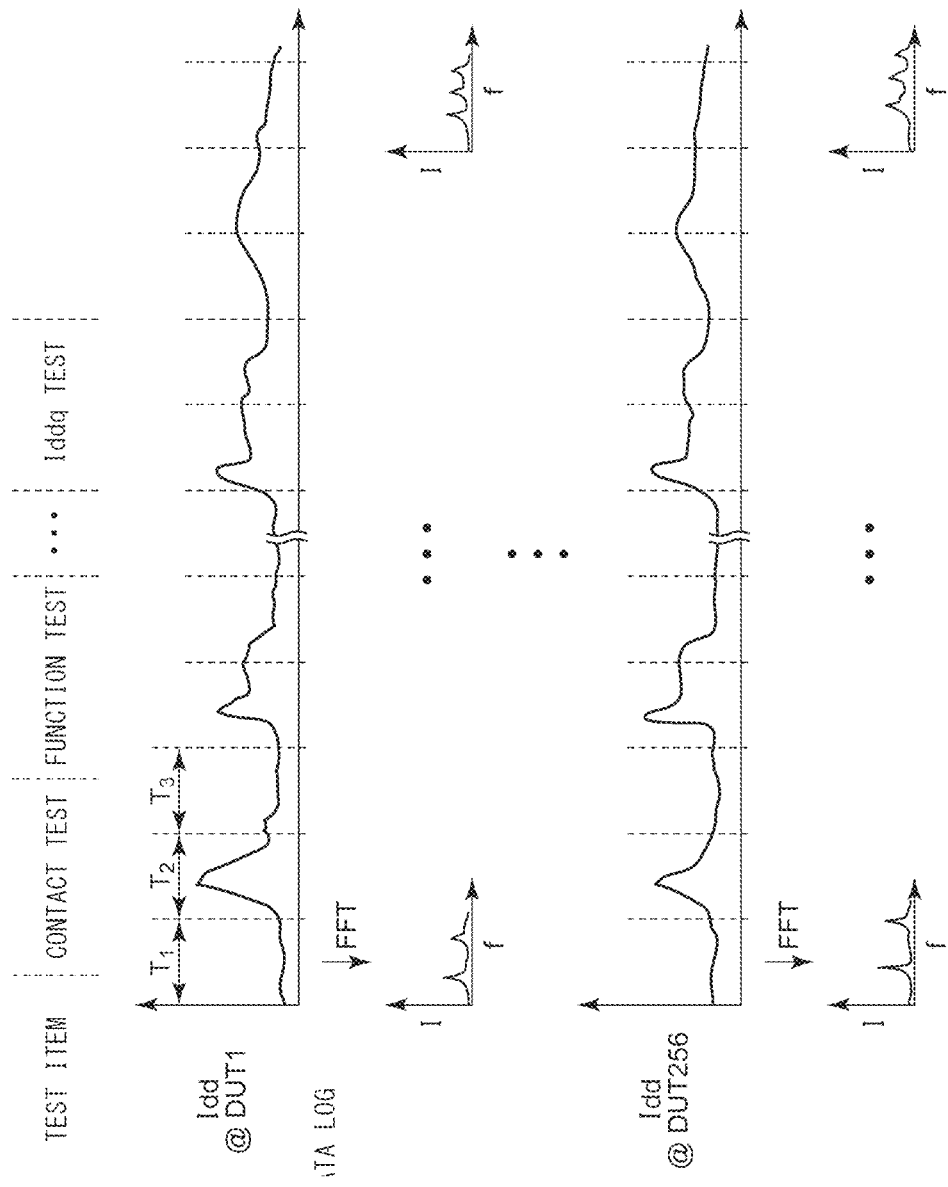
FIG. 16 is a diagram for explaining the spectrum data collection supported by the test system shown in FIG. 15.

FIG. 16 is a diagram for explaining the collection of the spectrum data by the test system 200 shown in FIG. 15. The power supply current Idd of each DUT is transmitted to the higher-level controller 110 with a predetermined period as a unit. The length of the period of the predetermined unit is designed corresponding to the period up to the time point at which the memory unit (bank) of the waveform data acquisition module 140 becomes full. The higher-level controller 110 converts each interval waveform of the power supply current Idd into spectrum data using an FFT (fast Fourier transform) method. Immediately after the FFT calculation is completed, the higher-level controller 110 transmits the interval waveform spectrum data of the power supply current Idd to the system controller 220. By repeating such an operation, this arrangement allows the system controller 220 to collect the spectrum data for all the DUTs over the entire period from the start up to the end of the test.

The higher-level controller 110 may transmit the power supply current Idd waveform itself to the system controller 220 in addition to or instead of the spectrum data.

Returning to FIG. 15, during a period in which the test plan is executed, each test site 210 switches the kind of test, and records the change of parameters as an event. The higher-level controller 110 records the time point at which such an event occurs, and the input value to the device.

The higher-level controller 110 acquires the waveform data acquired by the waveform data acquisition modules 140 and the pass/fail data sequence acquired by the function test modules 130 in a form associated with each other on the time axis. The pass/fail data sequence may be included in a data log described below.

Figure 17:
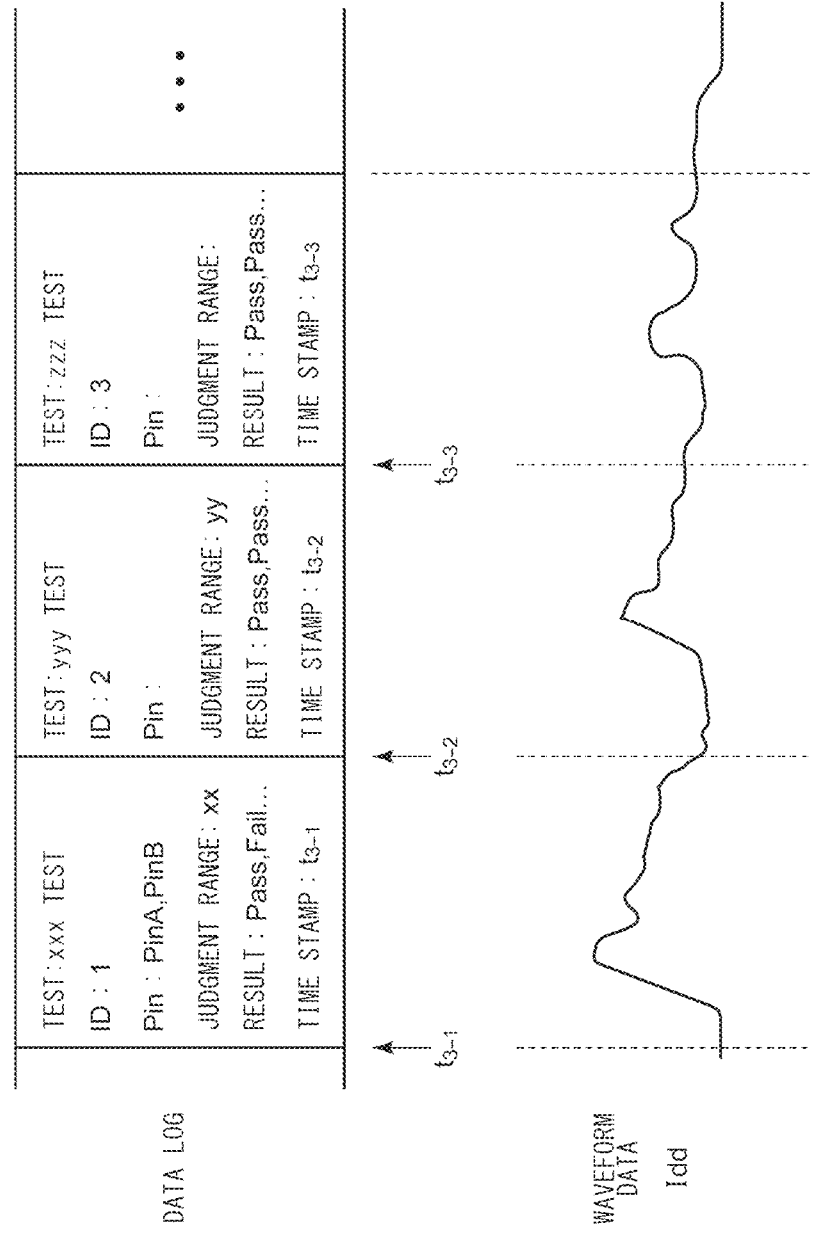
FIG. 17 is a diagram for explaining the data collection supported by the test system shown in FIG. 15.

FIG. 17 is a diagram for explaining data correction supported by the test system 200 shown in FIG. 15. In this example, the function test module 130 executes multiple test items (zzz, yyy, zzz). The test items correspond to the VCC(typ) item and VCC (Min) item included in the function test S202 shown in FIG. 14.

The higher-level controller 110 generates a data log that specifies the content of the test item for each test item, and transmits the data log thus generated to the system controller 220. The data log includes the name of the test item, the ID thereof, the pin number that was used, the judgment range, the pass/fail judgment result, and the time stamp that indicates the time point at which the test item was started. The time stamp included in the data log indicates a time point value corrected on the time axis of the higher-level controller 110. Furthermore, the higher-level controller 110 corrects the waveform data Idd to the time axis of the higher-level controller 110. This arrangement allows the waveform data Idd and the pass/fail time-series data to be associated with each other on the same time axis. Furthermore, this arrangement allows the test content, the test result, and the waveform of the electrical signal to be associated with each other so as to make an analysis.

After the test has been completed for all the test sites 210_1 through 210_K, the system controller 220 transmits the waveform data, spectrum data, and data log thus accumulated to the data server 230. With this arrangement, the data server 230 accumulates the waveform data or spectrum data with respect to a large number of devices under test tested and acquired in the mass-production stage, thereby generating big data. By utilizing the big data thus obtained, it is anticipated that this arrangement provides novel defect analysis or screening. Also, such an arrangement is anticipated to provide knowledge for improving the design, manufacturing, and testing process.

While the preferred embodiments of the present invention have been described using specific terms, such description is for illustrative purposes only, and it is to be understood that changes and variations may be made without departing from the spirit or scope of the appended claims.

What is claimed is:

1. A test apparatus comprising:
   at least one test module structured to execute a pattern program, to supply a test pattern to a device under test, and to measure a response signal which the device under test generates in response to the test pattern;
   a waveform data acquisition module including an A/D converter adaptive to operate while the at least one test module operates, wherein the A/D converter is structured to convert power supply signal supplied to the device under test into a digital signal with a predetermined sampling rate, wherein the waveform data acquisition module is structured to acquire waveform data which is a sequence of the digital signal, wherein the power supply signal is a power supply voltage or a power supply current which is supplied to the device under test and the power supply signal is different from the response signal; and
   a higher-level controller structured to instruct the test module to start the execution of the pattern program, to instruct the waveform data acquisition module to start the A/D conversion by the A/D converter, and to collect the waveform data acquired by the waveform data acquisition module in a form associated with the progress of the pattern program in the at least one test module, wherein a test plan includes a plurality of test items such as function test, AC parametric test and DC characteristic test,
   and wherein the higher-level controller records a time stamp that indicates a start time point and/or an end time point for each of the plurality of test items included in the test plan.

2. The test apparatus according to claim 1, wherein the waveform data acquisition module comprises:
   a first bank and a second bank; and
   a memory controller structured to continuously write the digital data to either the first bank or the second bank, and, when a given bank has become full, to notify the higher-level controller that the bank is full, and to switch a writing target memory unit to the other bank.

3. The test apparatus according to claim 2, wherein the higher-level controller reads data from a bank that has become full from among the first bank and the second bank in response to the notification.

4. The test apparatus according to claim 1, wherein the test apparatus is structured to be capable of transmitting, to a data server, at least one from among collected data and data obtained based on the collected data.

5. The test apparatus according to claim 1, wherein the test module judges whether or not the received signal matches its expected value so as to generate pass/fail data sequence,
   wherein the higher-level controller collects a data log including the pass/fail data sequence from the test module,
   and wherein the pass/fail data sequence and the waveform data are stored in a form associated with each other on a time axis.

* * * * *